(12) United States Patent
Mori et al.

(10) Patent No.: US 6,384,440 B1
(45) Date of Patent: May 7, 2002

(54) FERROELECTRIC MEMORY INCLUDING FERROELECTRIC CAPACITOR, ONE OF WHOSE ELECTRODES IS CONNECTED TO METAL SILICIDE FILM

(75) Inventors: Hidemitsu Mori; Seiichi Takahashi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/703,730

(22) Filed: Nov. 2, 2000

(30) Foreign Application Priority Data

Nov. 10, 1999 (JP) .......................................... 11-319296

(51) Int. Cl.[7] .............................................. H01L 27/02
(52) U.S. Cl. ....................... 257/296; 257/300; 257/303; 257/306; 257/307; 257/308; 257/309; 257/310; 257/311
(58) Field of Search ................... 257/306–311

(56) References Cited

U.S. PATENT DOCUMENTS

| 5,099,305 A | * | 3/1992 | Takenaka ...................... 357/51 |
| 5,555,486 A | | 9/1996 | Kingon et al. .............. 361/305 |

FOREIGN PATENT DOCUMENTS

| DE | 195 15 347 A1 | 11/1995 |
| EP | 0 697 720 A1 | 2/1996 |
| JP | 02-94571 | 4/1990 |
| JP | 02-232973 | 9/1990 |
| JP | 04-6867 | 1/1992 |
| JP | 04-206869 | 7/1992 |
| JP | 06-120072 | 4/1994 |
| JP | 06-125057 | 5/1994 |
| JP | 08-191133 | 7/1996 |
| JP | 08-191137 | 7/1996 |
| JP | 09-82914 | 3/1997 |
| JP | 11-8360 | 1/1999 |
| JP | 11-87633 | 3/1999 |
| JP | 2926050 | 5/1999 |
| JP | 11-145422 | 5/1999 |
| JP | 11-163279 | 6/1999 |
| JP | 11-297942 | 10/1999 |

OTHER PUBLICATIONS

Patent Abstracts of Japan, vol. 016, No. 542 (E–1290), Nov. 12, 1992.
Patent Abstracts of Japan, vol. 096, No. 5, May 31, 1996.

* cited by examiner

Primary Examiner—Fetsum Abraham
(74) Attorney, Agent, or Firm—Sughrue Mion, PLLC

(57) ABSTRACT

A ferroelectric memory is composed of a wiring layer, a bottom electrode coupled to the wiring layer, a ferroelectric film formed on the bottom electrode, a top electrode formed on the ferroelectric film, and a metal silicide layer coupled to the top electrode and located above the ferroelectric film. The wiring layer includes substantially no silicon.

11 Claims, 23 Drawing Sheets

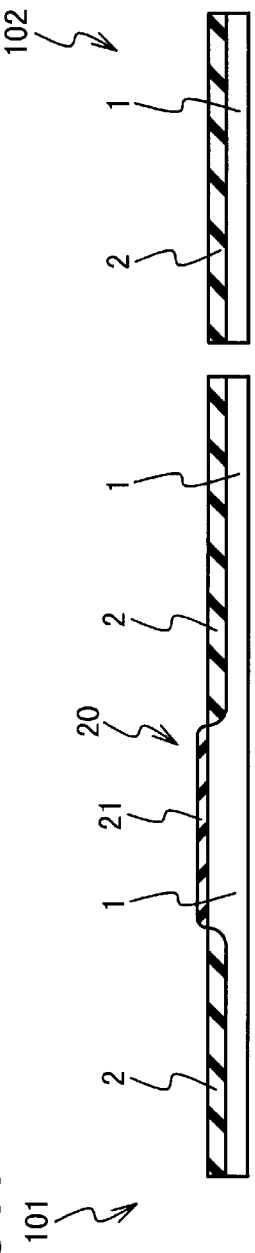
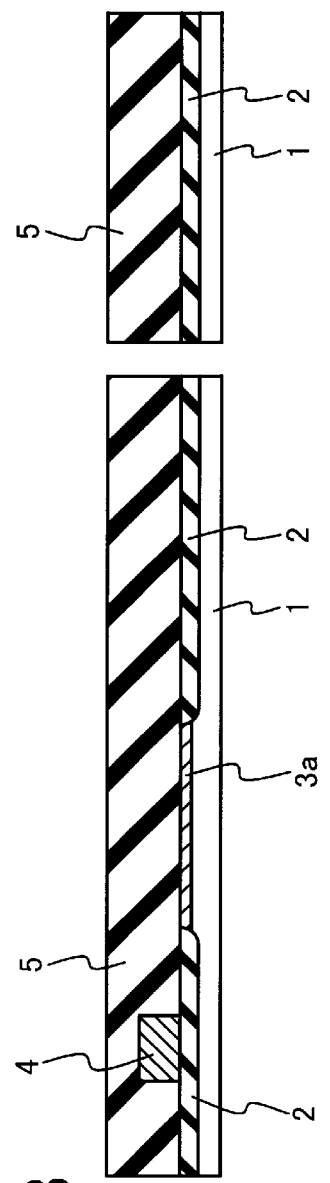
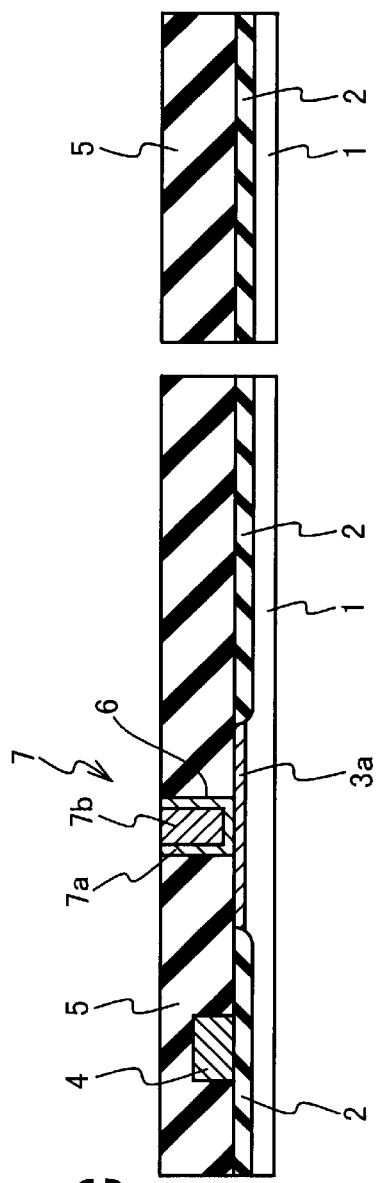
Fig. 5A
Fig. 5B
Fig. 5C

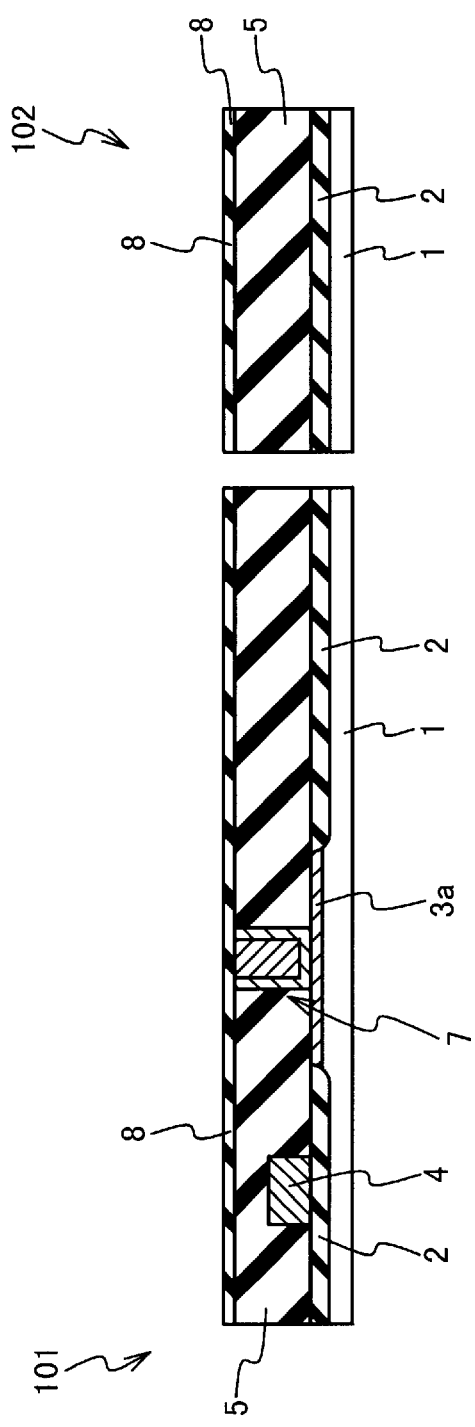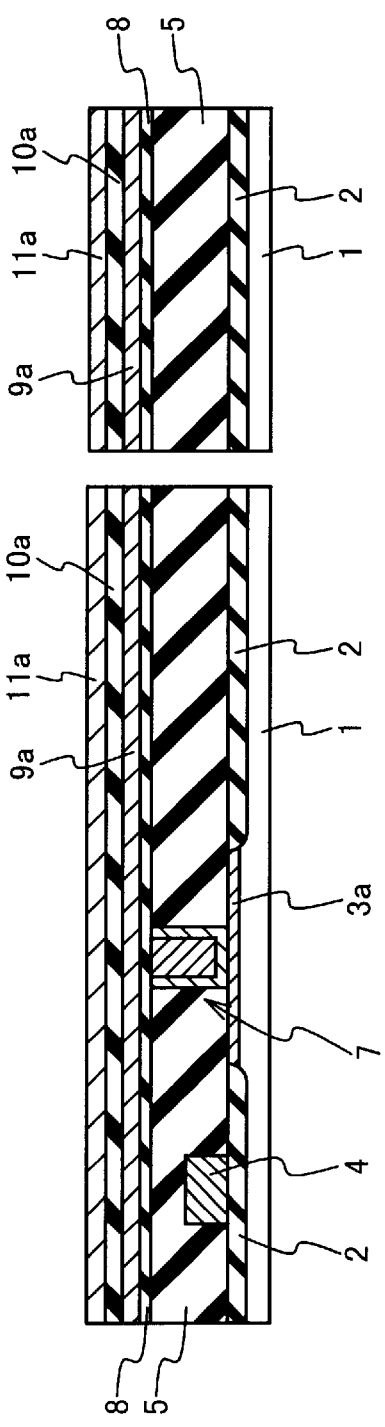

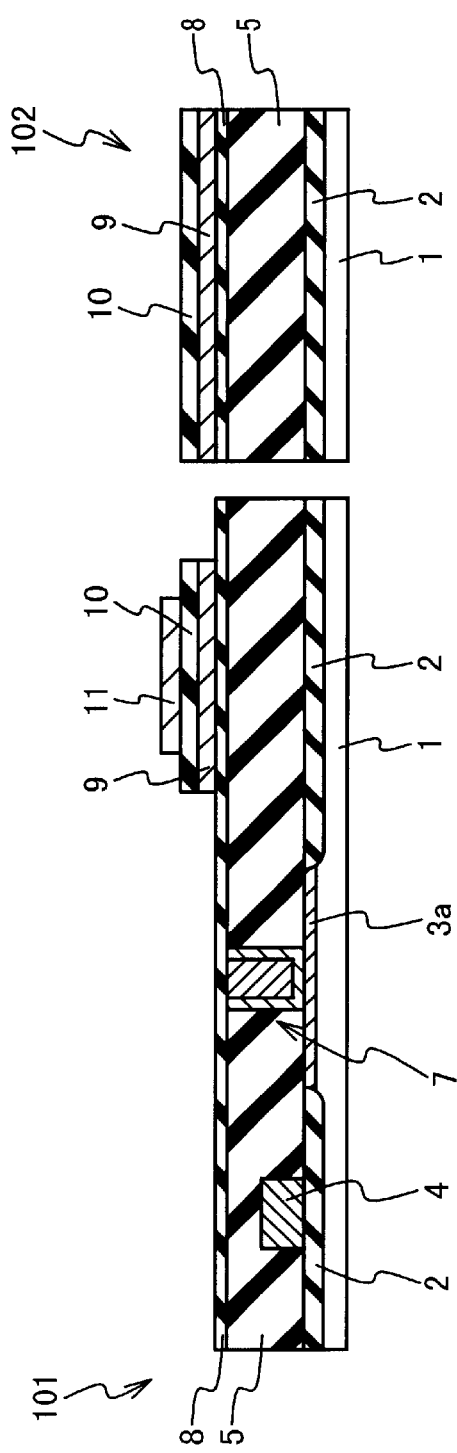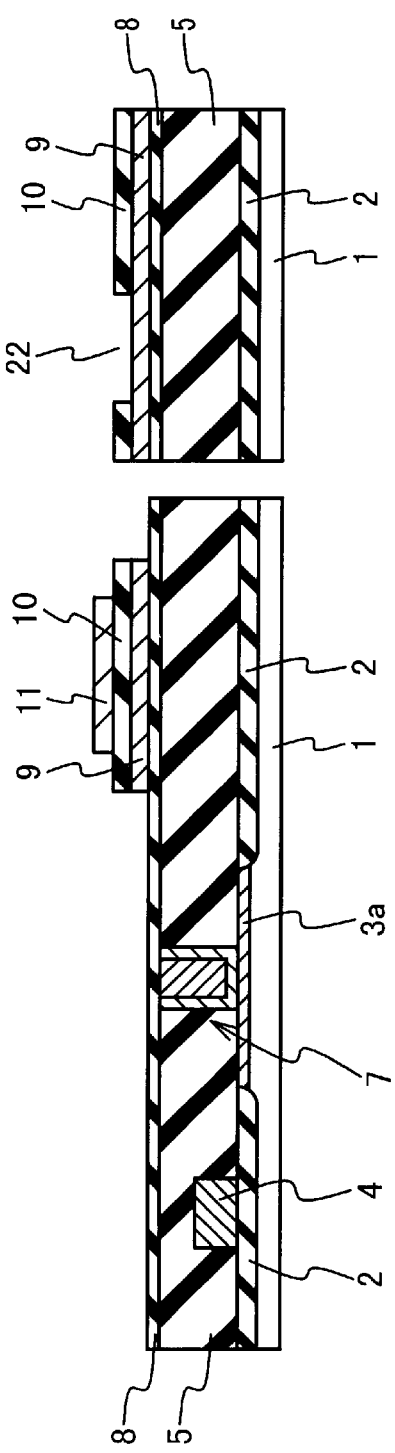

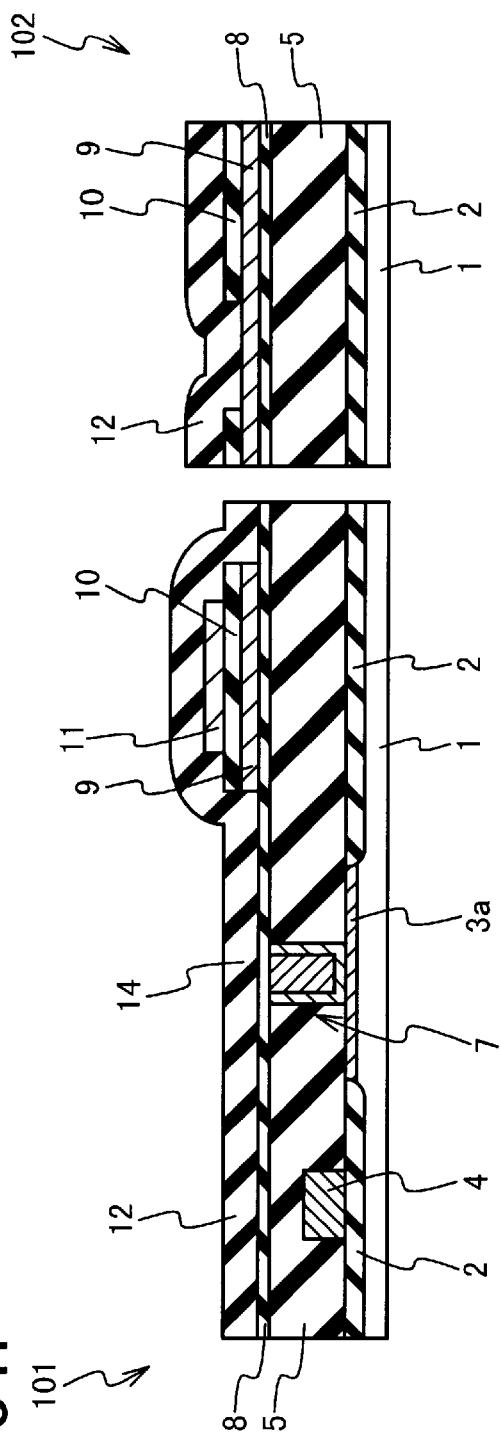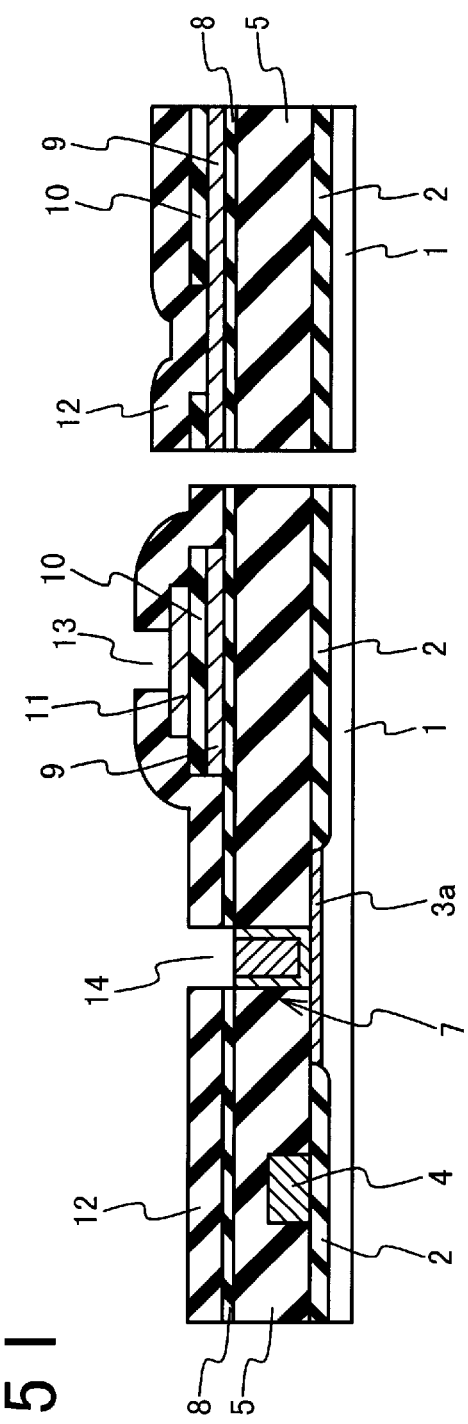

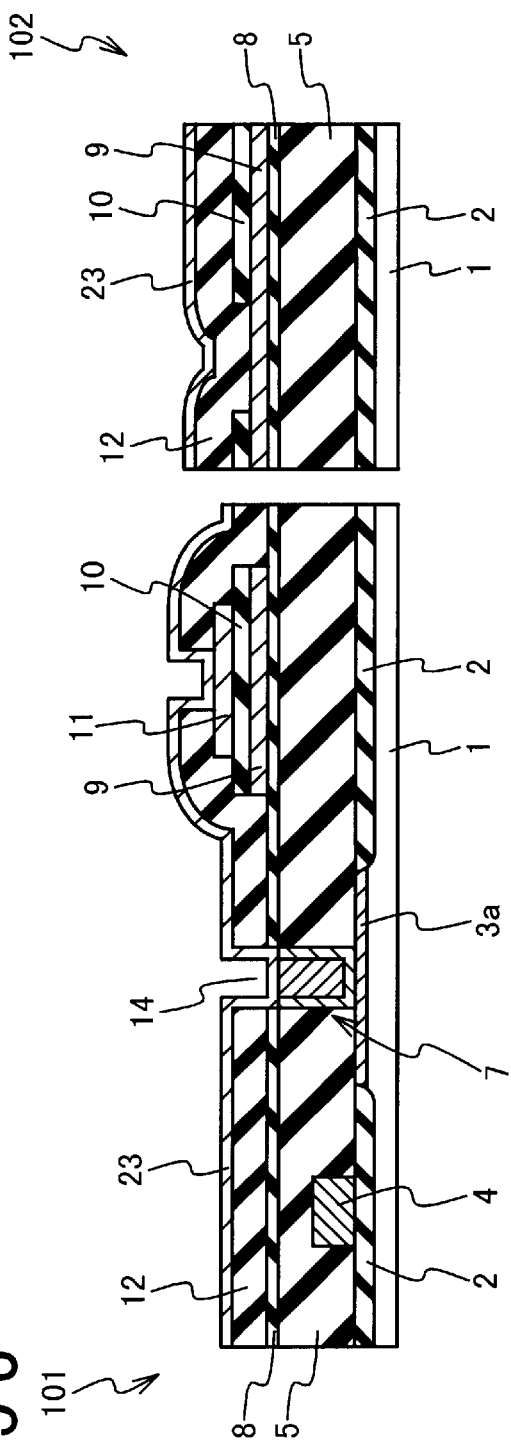
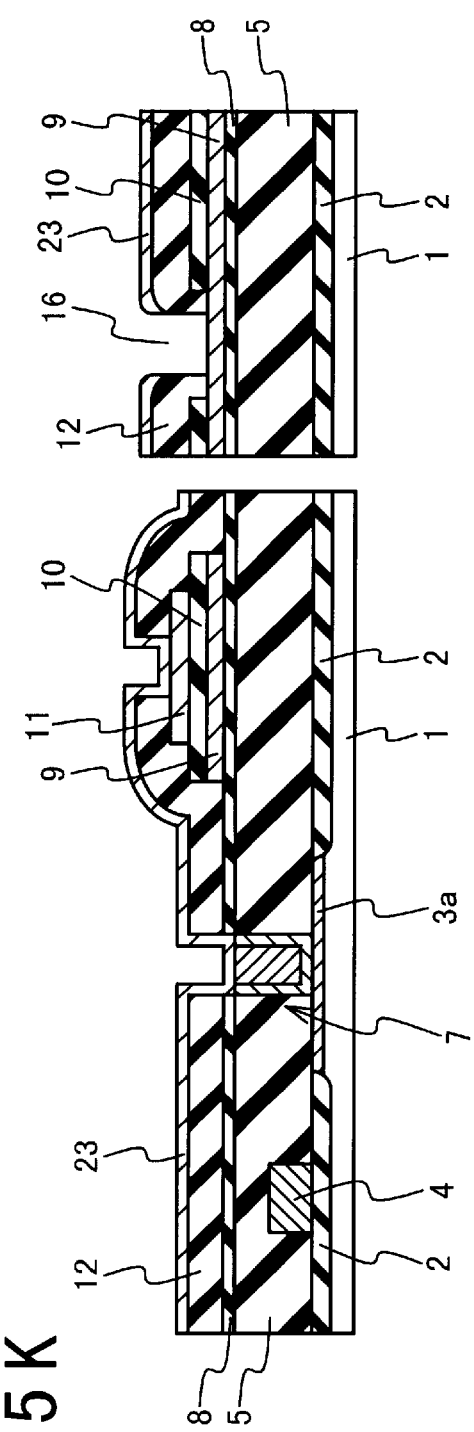

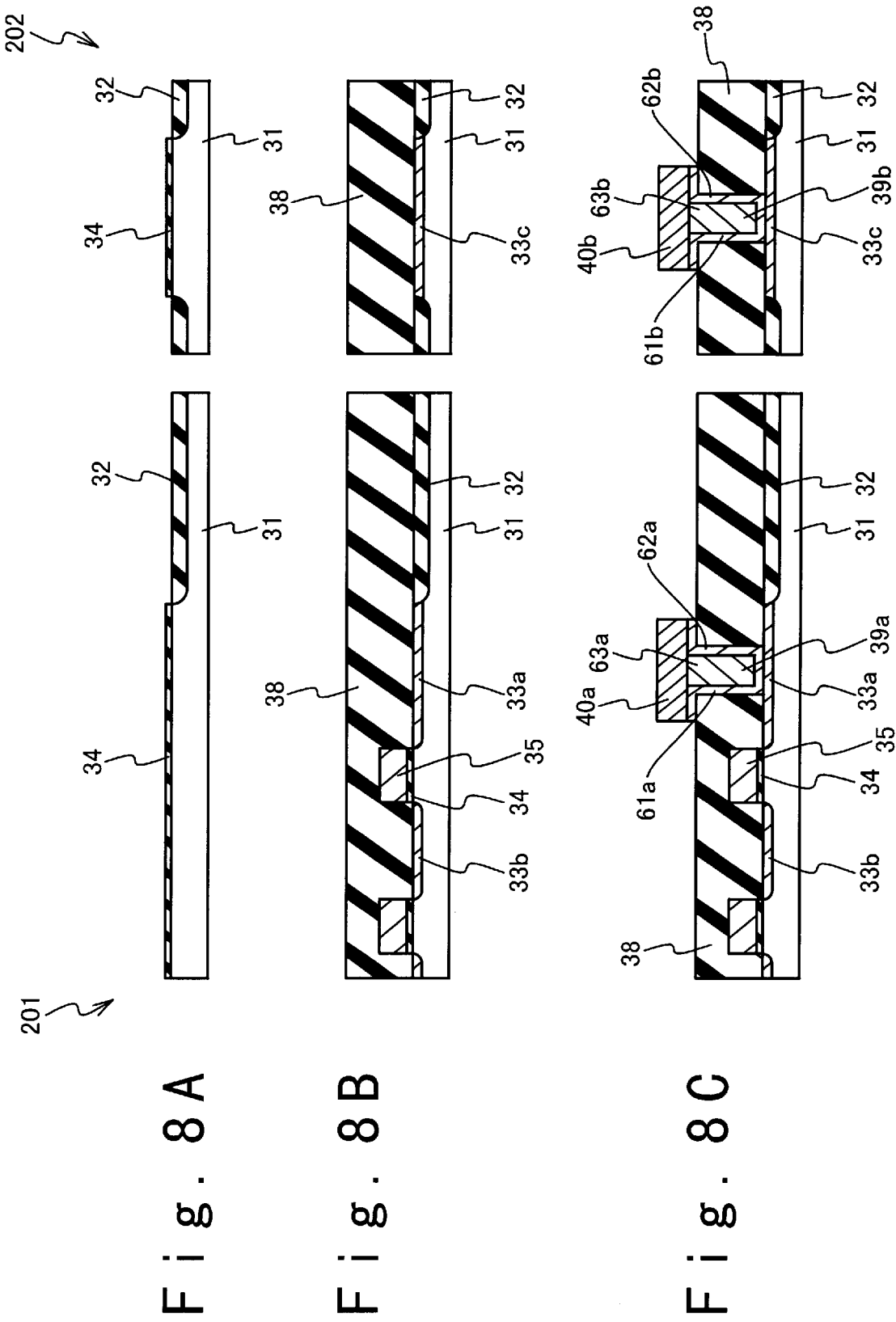

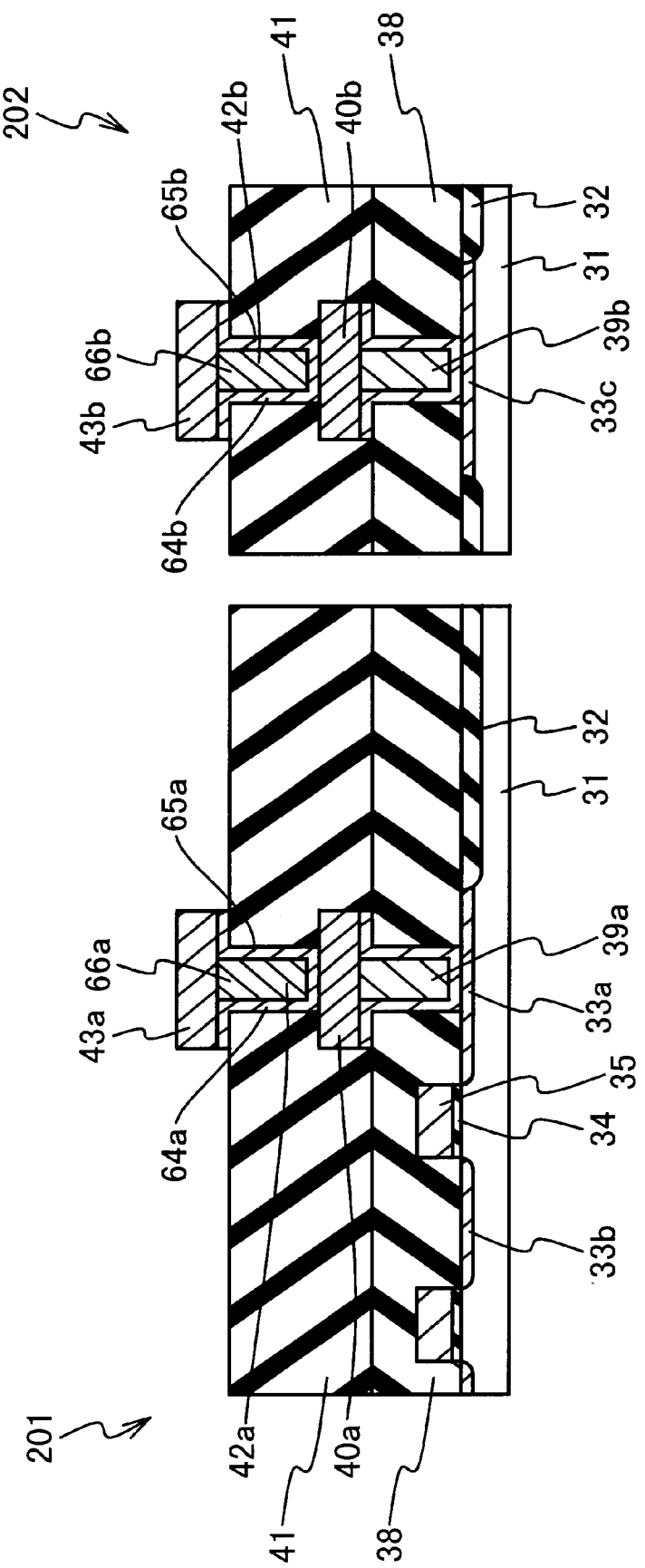

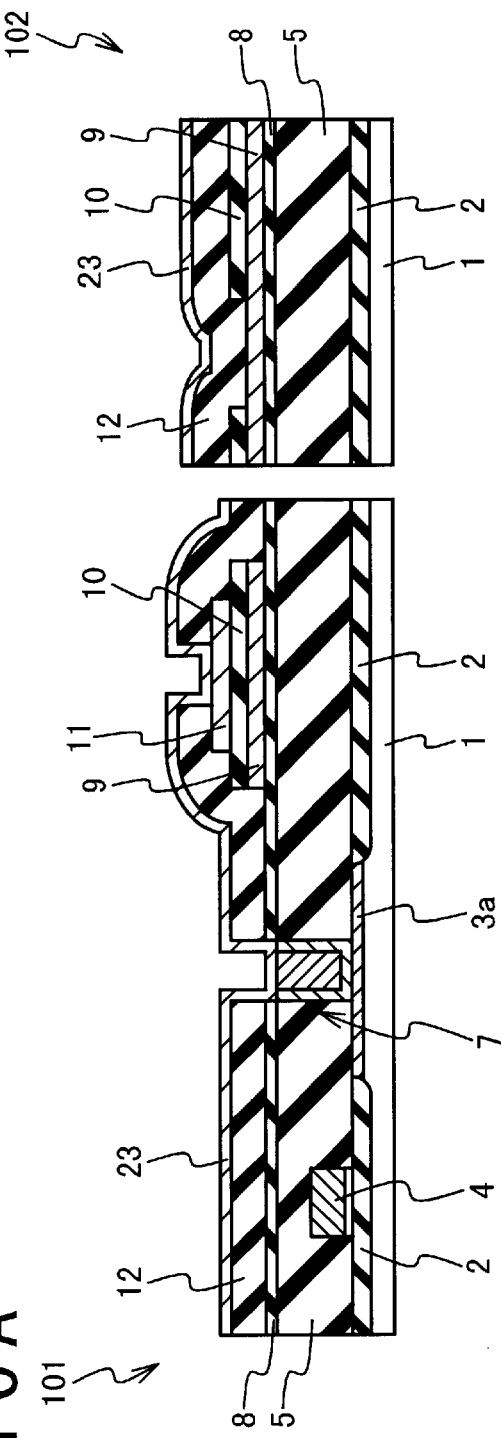
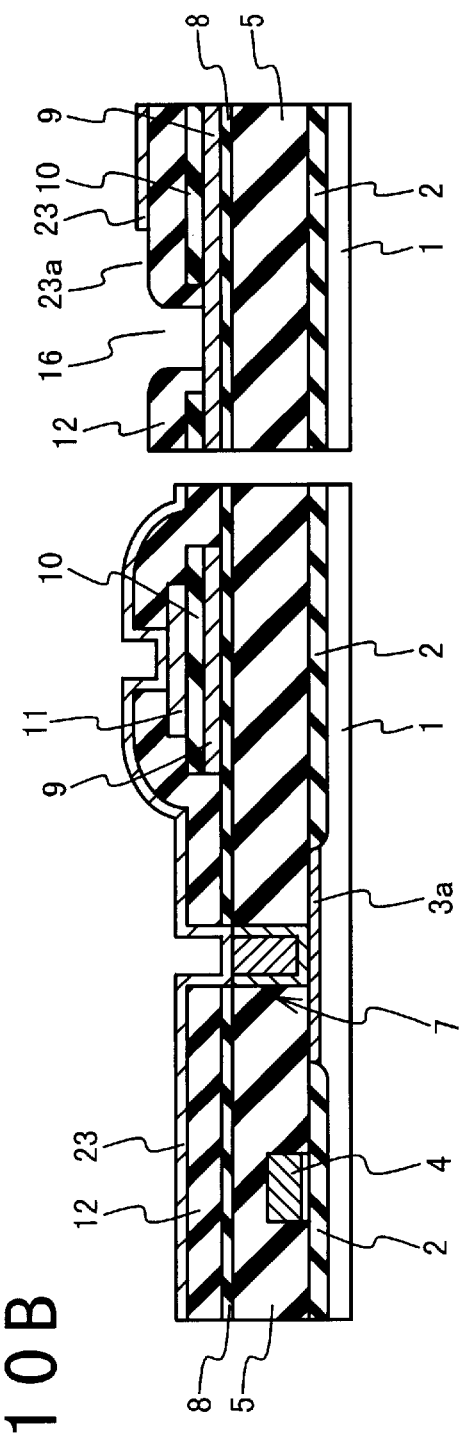
Fig. 10A
Fig. 10B

FERROELECTRIC MEMORY INCLUDING FERROELECTRIC CAPACITOR, ONE OF WHOSE ELECTRODES IS CONNECTED TO METAL SILICIDE FILM

BACKGROUND OF THE INVENTION

1. Field of the Invention

The present invention relates to a ferroelectric memory. More particularly, the present invention relates to a ferroelectric memory including a ferroelectric capacitor used for a cell of the ferroelectric memory.

2. Description of the Related Art

A non-volatile memory can be attained by using a ferroelectric material as a capacitor insulating film of a memory cell. The ferroelectric material shows a hysteretic property. Data is accumulated in a non-volatile manner by using the hysteretic property. Such a non-volatile memory provides a random access at a time of about 100 ns. Therefore, it is referred to as an FeRAM (Ferroelectric Random Access Memory).

The FeRAM is expected to be applied in a field in which other non-volatile memories such as an EEPROM (Electric Erasable Programmable Read Only Memory) and a flash memory can not be used. This is because an operation of the FeRAM is much faster than those of a EEPROM and a flash memory, and the FeRAM can be operated at a low power supply voltage of about 3.5 V.

In a development of an FeRAM, it is important to develop a structure of an FeRAM in which a remnant polarization of a ferroelectric film used in a memory cell is not deteriorated, and a process for manufacturing it.

The FeRAM having a structure in which the remnant polarization of the ferroelectric film is not deteriorated is disclosed in Japanese Laid Open Patent Application (JP-A-Heisei, 11-297942) corresponding to U.S. application Ser. No. 09/287,413. The disclosure of the above U.S. Application is incorporated herein by reference.

FIG. 1 shows the structure of the known FeRAM. The known FeRAM employs a planar type cell. The FeRAM is composed of a semiconductor substrate 501, a ferroelectric capacitor 502 provided above the semiconductor substrate 501, and a protecting film 503 of $SiO_2$ provided on the ferroelectric capacitance element 502.

The ferroelectric capacitor 502 is composed of a lower electrode 504, an upper electrode 505 and a ferroelectric film 506 that is sandwiched by them. The upper electrode 505 is composed of $IrO_2$ or Ir film.

A contact hole 507 is formed in the protecting film 503 through to the upper electrode 505.

Another contact hole 508 is formed in the protecting film 503 through to a diffusion layer 509 formed on the semiconductor substrate 501.

The ferroelectric capacitor 502 and the diffusion layer 509 are electrically connected to a wiring layer 510 through the contact holes 507 and 508, respectively.

The wiring layer 510 is constituted by a lamination film composed of a metal silicide film such as tungsten silicide, a titanium nitride film, an aluminum film, and a titanium nitride film. The metal silicide layer is connected to the upper electrode 505 and the diffusion layer 509.

The ferroelectric film 506 has a large remnant polarization. This is because the material included in the wiring layer 510 is not diffused to the ferroelectric film 506 through a high temperature annealing and thereby the ferroelectric film 506 is not deteriorated. Moreover, the thermally induced stress resulting from the wiring layer 510 has no influence on the ferroelectric film 506.

Here, it is necessary that the lower electrode 504 of the FeRAM is connected to a wiring layer for giving a potential to the electrode 504. It is desirable that this wiring layer is surely connected to the lower electrode 504.

However, how the wiring layer is connected to the lower electrode 504 is not noted in the above-mentioned Japanese Laid Open Patent Application (JP-A-Heisei, 11-297942) corresponding to the U.S. application Ser. No. 09/287,413.

With regard to the structure of the connection portion between the electrode and the wiring layer, other techniques are disclosed in Japanese Laid Open Patent Application (JP-A-Heisei, 11-8360, JP-A-Heisei, 11-163279, JP-A-Heisei, 6-125057 and JP-A-Heisei, 11-145422, and Japanese Patent Office Gazette (2926050).

We have investigated how the wiring layer should be connected to the electrode of the memory cell capacitor of the FeRAM. As a result, we obtain the following inventions.

SUMMARY OF THE INVENTION

Therefore, an object of the present invention is to protect the characteristics of a memory cell capacitor from being deteriorated and to surely connect a wiring to an electrode of the memory cell capacitor.

Another object of the present invention is to protect the characteristics of a memory cell capacitor from being deteriorated, in a ferroelectric memory employing a planar type cell, and to surely connect a wiring to an electrode of the memory cell capacitor.

Still another object of the present invention is to protect the characteristics of a memory cell capacitor from being deteriorated and to protect an electrode of the memory cell capacitor from being stripped.

Still another object of the present invention is to protect a wiring connected to an electrode of a memory cell capacitor from being stripped.

In order to achieve an aspect of the present invention, a ferroelectric memory is composed of a wiring layer including substantially no silicon, a bottom electrode coupled to the wiring layer, a ferroelectric film formed on the bottom electrode, a top electrode formed on the ferroelectric film, and a metal silicide layer coupled to the top electrode and located above the ferroelectric film.

In the ferroelectric capacitor, it is possible to suppress the deterioration of the ferroelectric film resulting from a annealing process carried out after the formation of the metal wiring. This is because the metal silicide film is formed above the ferroelectric film. The metal silicide film effectively protects the bad influence on the ferroelectric film caused by the thermal stress of the wiring. As a result, the deterioration of the ferroelectric film is not easily induced. Moreover, in the ferroelectric capacitor according to the present invention, it is possible to protect the strip of the films of the wiring and the lower electrode and also avoid the conductive defect in a contact to the lower electrode and the increase in resistance. This is because the lower electrode and the metal silicide are not in direct contact with each other.

The wiring and the ferroelectric film may be located on a same side of the bottom electrode. In the FeRAM employing the planar type cell, it is possible to suppress the deterioration of the ferroelectric film and further possible to protect the conductive defect in the contact to the lower electrode and the increase in the resistance.

The ferroelectric memory may be further composed of another metal silicide layer, wherein the wiring layer penetrates the other metal silicide layer.

In this case, the other metal silicide layer may cover at least a portion of the ferroelectric film. The other metal silicide layer suppress the deterioration of the ferroelectric film.

The ferroelectric memory may be further composed of another bottom electrode fabricated at the same time of the bottom electrode, another ferroelectric film coupled to the other bottom electrode, and another wiring layer coupled to the other bottom electrode. In this case, the other wiring layer penetrates the other ferroelectric film.

The other bottom electrode can be used as a conductive island to be connected to still another wiring layer. The other bottom electrode enlarges a facility for arranging elements and interconnections of the ferroelectric memory.

The ferroelectric memory may be further composed of another metal silicide layer fabricated at the same time of the metal silicide layer. In this case, the other wiring layer penetrates the other metal silicide layer.

The metal silicide layer may be formed of tungsten silicide.

Also, The top electrode may include an iridium oxide film and an iridium film. In this case, it is desirable that the iridium oxide film is formed on the ferroelectric film and the iridium film is formed on the iridium oxide film. Both of the iridium oxide film and the iridium are hard to react with metal silicide film. Therefore, the characteristics of the ferroelectric film is not deteriorated by the diffusion of silicon into the ferroelectric film.

The bottom electrode is desirably formed of platinum. The ferroelectric film formed on a platinum film have excellent characteristics.

In order to achieve another aspect of the present invention, a method of fabricating a ferroelectric memory is composed of forming a ferroelectric capacitor including:
   a bottom electrode,
   a ferroelectric film formed on the bottom electrode, and
   a top electrode coupled to the ferroelectric film;
   forming a metal silicide layer coupled to the top electrode and located above the ferroelectric film; and
   forming a wiring layer including substantially no silicon and coupled to the bottom electrode.

The method may be further composed of
   forming an interlayer insulating film on the ferroelectric capacitor;
   forming a first contact hole through the interlayer insulating film to the top electrode. In this case, the forming the metal silicide layer includes forming a metal silicide film on the interlayer insulating film and the top electrode. The metal silicide film is coupled to the top electrode inside the contact hole. Also, the forming the wiring layer includes:
   forming a second contact hole through the metal silicide film and the interlayer insulating film; and
   forming the wiring layer through the second contact hole to the bottom electrode.

The forming the second contact hole may include:
   selectively removing a selected portion of the metal silicide film; and
   forming the second contact hole whose width is narrower than that of the selected portion.

Also, the forming the metal silicide layer may include etching the metal silicide film to form the metal silicide layer.

The top electrode may include an iridium oxide film coupled to the ferroelectric film, and an iridium film coupled to the iridium oxide film.

In this case, the method may be further composed of etching a surface portion of the iridium film before the forming the metal silicide layer. The metal silicide film is coupled to the surface portion. The removal of the surface portion reduce a contact resistance between the metal silicide layer and the top electrode.

The method may be further composed of:
   forming another bottom electrode at the same time of the bottom electrode;
   forming another ferroelectric film coupled to the other bottom electrode;
   forming another metal silicide layer; and
   forming another wiring layer coupled to the other bottom electrode. The other wiring layer penetrates the other ferroelectric film and the other metal silicide film.

In this case, the method may be further composed of:
   forming a metal silicide film connected to the top electrode; and
   etching the metal silicide film to form the metal silicide layer and the other metal silicide layer.

BRIEF DESCRIPTION OF THE DRAWINGS

FIG. 4A is a section view showing a structure of a memory cell area of an FeRAM investigated by the Inventor and the like;

FIG. 4B is a section view showing a structure of a contact formation area of an FeRAM investigated by the Inventor and the like;

FIGS. 5A to 5K are section views showing a method for manufacturing the FeRAM according to the first embodiment;

FIGS. 8A to 8L are section views showing a method for manufacturing the FeRAM according to the second embodiment;

FIGS. 10A and 10B are section views showing a method for manufacturing the FeRAM according to the third embodiment.

DESCRIPTION OF THE PREFERRED EMBODIMENTS

Embodiments of the present invention will be described below with reference to the attached drawings.

First Embodiment

Figure 1:
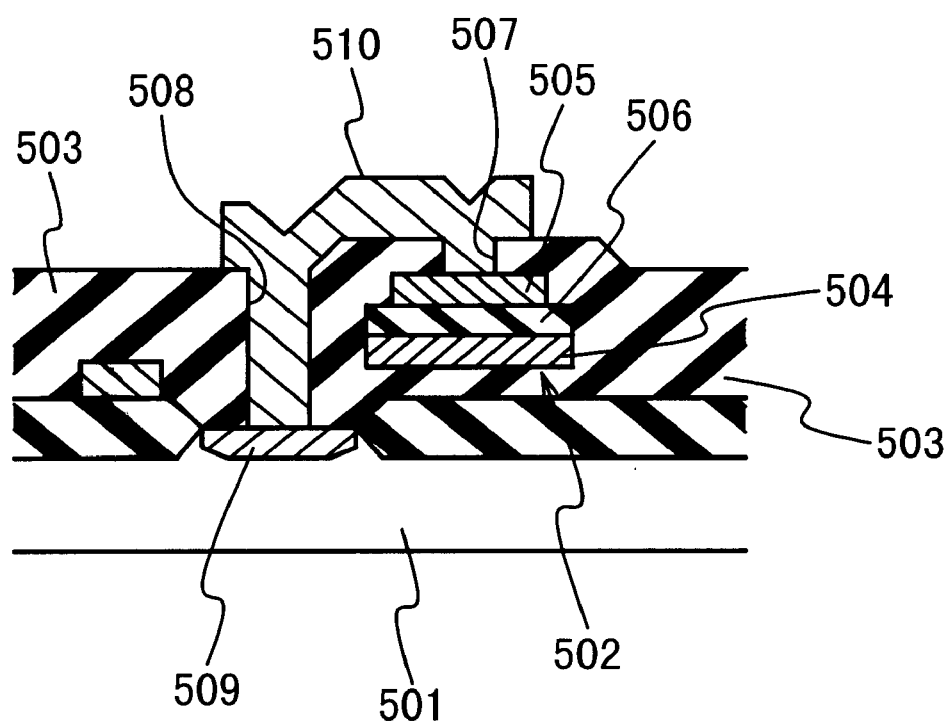
FIG. 1 shows a structure of a conventional ferroelectric memory.
Figure 2:
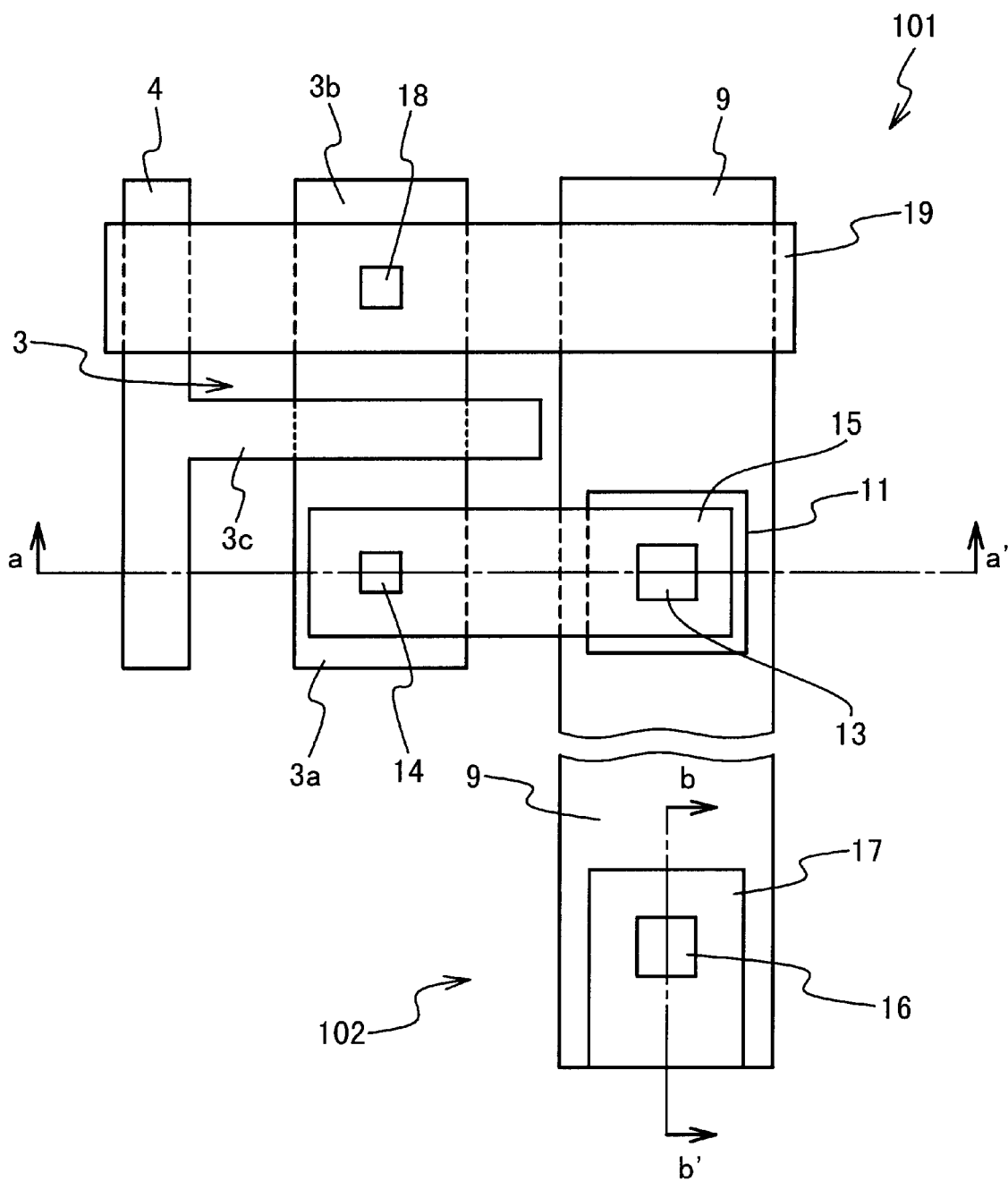
FIG. 2 is a plan view showing a structure of an FeRAM according to a first embodiment.

FIG. 2 is a plan layout view showing an FeRAM of the first embodiment. The FeRAM is provided with a memory cell area 101 and a contact formation area 102. The memory cell area 101 is an area in which a memory cell of the FeRAM is formed. The contact formation area 102 is an area in which a contact between a wiring 17 and a lower electrode 9 serving as a plate line of the memory cell is formed.

Figure 3A:
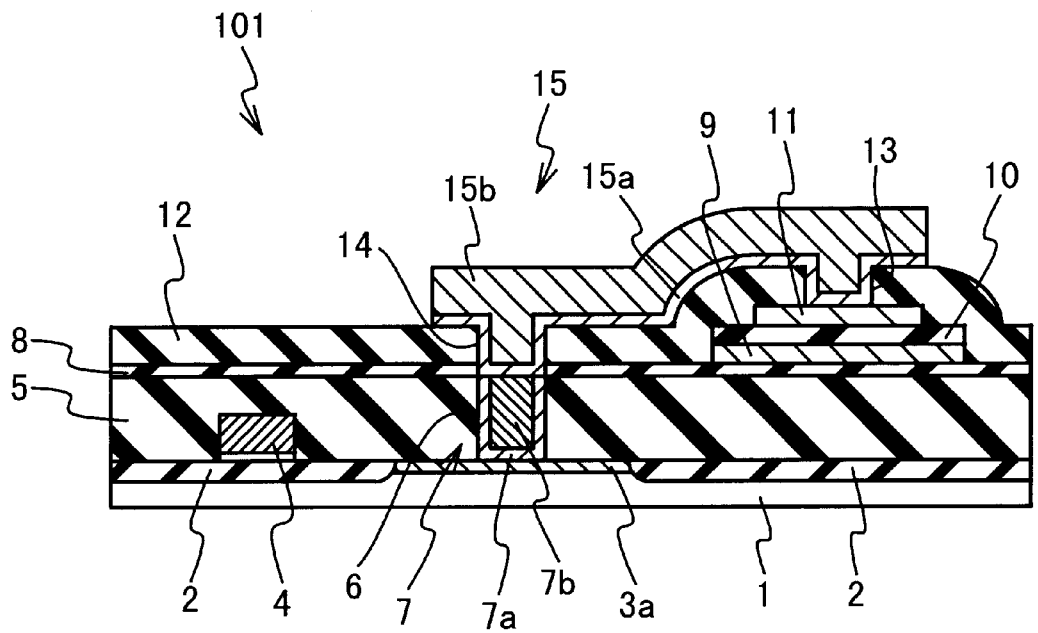
FIG. 3A is a section view showing a structure of a memory cell area of the FeRAM according to the first embodiment.
Figure 3B:
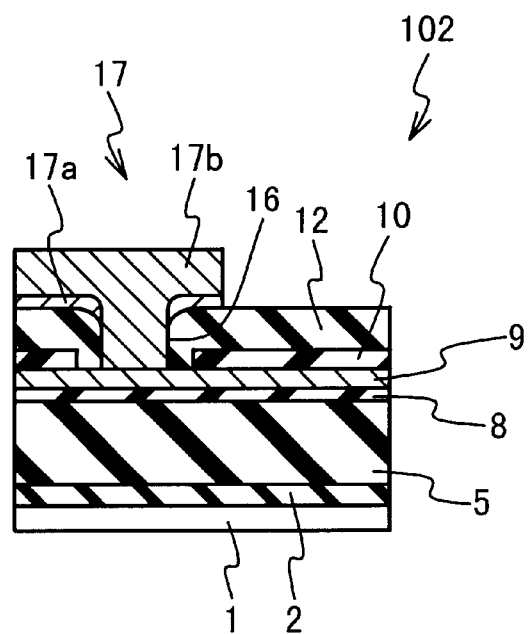
FIG. 3B is a section view showing a structure of a contact formation area of the FeRAM according to the first embodiment.

FIG. 3A is a section view taken on the section A–A' of FIG. 2 showing the sectional structure of the memory cell area 101. FIG. 3B is a sectional view taken on the section b–b' of FIG. 2 showing the sectional structure of the contact formation area 102.

Referring to FIGS. 3A and 3B, the FeRAM includes a P-type semiconductor substrate 1. A field oxide film 2 and an N+ diffusion layer 3a are formed on the P-type semiconductor substrate 1.

As shown in FIG. 2, the N+ diffusion layer 3a is a source/drain of a MOS transistor 3. The MOS transistor 3 further includes a N+ diffusion layer 3b and a gate electrode 3c. The N+ diffusion layer 3b is connected through a contact hole 18 to a bit line 19. The gate electrode 3c is connected to a word line 4.

The word line 4 is formed on the field oxide film 2, as shown in FIG. 3A.

As shown in FIGS. 3A and 3B, an inter-layer insulation film 5 is formed on the field oxide film 2, the N+ diffusion layer 3a and the word line 4. A contact hole 6 is formed in the inter-layer insulation film 5. The contact hole 6 penetrates the inter-layer insulation film 5 and reaches the N+ diffusion layer 3a. The inside of the contact hole 6 is filled with a tungsten plug 7. The tungsten plug 7 is composed of a TiN/Ti film 7a and a tungsten portion 7b.

A plug protection film 8 is formed on the inter-layer insulation film 5. The plug protection film 8 is composed of a silicon nitride film having a thickness of about 100 nm and a silicon oxide film having a thickness of about 100 nm (not shown). The silicon oxide film is connected to the inter-layer insulation film 5. The silicon oxide film improves the adhesion between the silicon nitride film and a later-described lower electrode 9. Here, the silicon nitride film can be replaced by a silicon oxide nitride (SiON) film. The plug protection film 8 protects the tungsten plug 7 in a process for manufacturing the FeRAM. The effect of the plug protection film 8 is evidently described in the later-described explanation of a method for manufacturing the FeRAM.

The lower electrode 9, a ferroelectric film 10, and an upper electrode 11 are formed in turn on the plug protection film 8. The lower electrode 9 is composed of laminated Ti film (not shown) and Pt film (not shown). The Ti film is connected to the plug protection film 8, and the Pt film is connected to the Ti film. The lower electrode 9 functions as the plate line of the memory cell.

Here, another material may be used for the lower electrode 9. However, it is desirable that the portion in contact with the ferroelectric film 10 is made of Pt. This is because it improves the characteristic of the ferroelectric film 10. From viewpoint of the characteristic of the ferroelectric film 10, it is necessary that the lower electrode 9 is made of Pt even if Pt is the material having the reaction to the metal silicide.

The ferroelectric film 10 is made of ferroelectric material, such as PZT ($PbZr_xTi_{1-x}O_3$) film and SBTN film ($SrBi_2Ta_xNb_{2-x}O_9$).

The upper electrode 11 is composed of laminated $IrO_2$ film and Ir film (not shown). The $IrO_2$ film is connected to the ferroelectric film 10. The Ir film is connected to the $IrO_2$ film. The upper electrode 11 functions as a storage node.

The inter-layer insulation film 12 is formed on the plug protection film 8, the lower electrode 9, the ferroelectric film 10 and the upper electrode 11.

In the memory cell area 101, a contact hole 13 is formed so as to reach the upper electrode 11, in the inter-layer insulation film 12. Moreover, a contact hole 14 is formed so as to penetrate the plug protection film 8 and the inter-layer insulation film 12. The contact hole 14 reaches the tungsten plug 7. A wiring 15 is formed on the inter-layer insulation film 12. The wiring 15 connects the upper electrode 11 and the N+ diffusion layer 3a to each other through the contact holes 13, 14.

The wiring 15 includes a metal silicide layer 15a and a metal wiring layer 15b. The metal silicide layer 15a is made of silicide material such as tungsten silicide.

The metal silicide layer 15a is connected to an upper electrode 13. As mentioned above, the top electrode is composed of $IrO_2$ and Ir films, both of which are hard to react to the metal silicide layer 15a. $IrO_2$ and Ir films prevent silicon included in the metal silicide layer 15a from diffusing into the ferroelectric film 10. Therefore, the ferroelectric film 10 is not deteriorated or degraded by the diffusion of the silicon into the ferroelectric film 10.

The metal wiring layer 15b is formed on the metal silicide layer 15a. The metal wiring layer 15b includes a Ti film, a first TiN film, an Al film and a first TiN film which are laminated in turn (not shown). The Ti film is connected to the metal silicide layer 15a. The first TiN film is connected to the Ti film. The Al film is connected to the first TiN film. The second TiN film is connected to the Al film.

Also, in the contact formation area 102, a contact hole 16 is formed in the inter-layer insulation film 12, as shown in FIG. 3B. A wiring 17 is formed on the inter-layer insulation film 12. The wiring 17 is connected through the contact hole 16 to the lower electrode 9. The wiring 17 is connected to the lower electrode 9, on the same surface as the ferroelectric film 10.

The wiring 17 is composed of a metal silicide layer 17a and a metal wiring layer 17b. The metal silicide layer 17a is made of silicide material such as tungsten silicide, similarly to the metal silicide layer 15a.

The metal wiring layer 17b penetrates the metal wiring layer 17a, and it is connected to the lower electrode 9. The metal wiring layer 17b includes a Ti film, a first TiN film, an Al film and a second TiN film which are laminated in turn. (not shown). The Ti film is connected to the lower electrode 9. The first TiN film is connected to the Ti film. The Al film is connected to the first TiN film. The second TiN film is connected to the Al film.

Figure 4A:
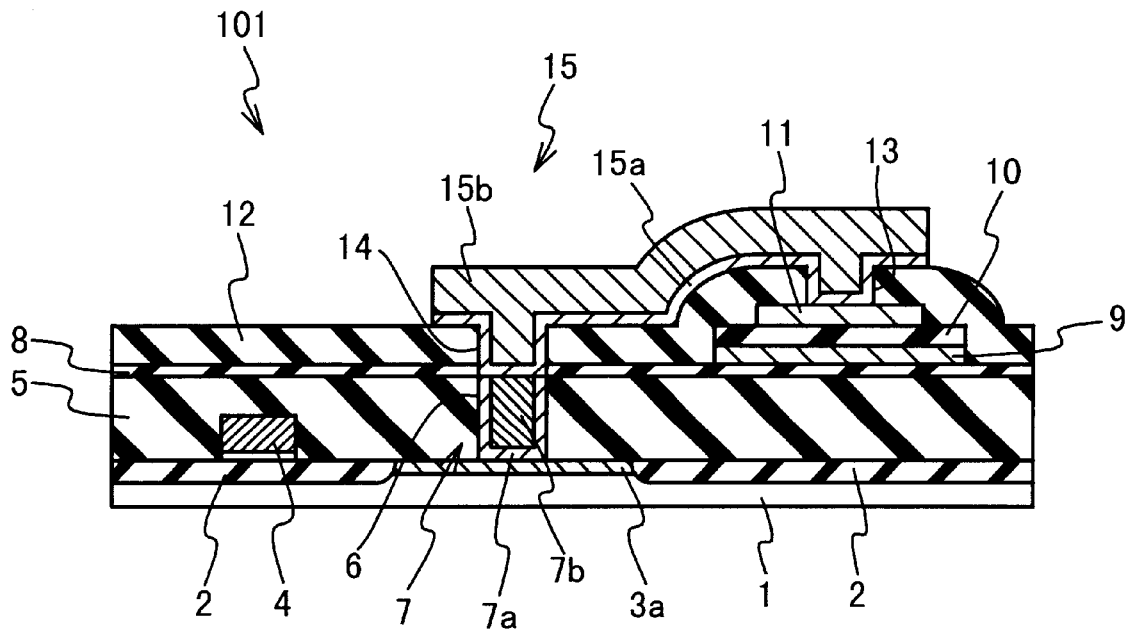
Figure 4B:
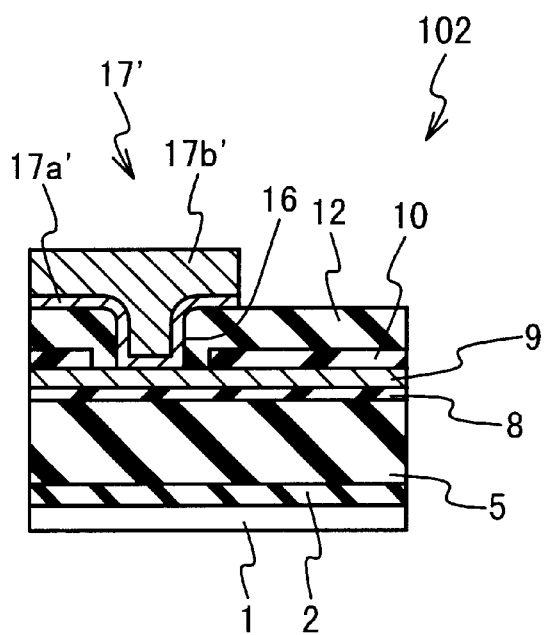

We obtained the conclusion of the FeRAM in the first embodiment, as mentioned above, by investigating the FeRAM having the structure shown in FIGS. 4A and 4B.

The investigated FeRAM is different in structure of connection between the lower electrode 9 and the wiring 17 from the FeRAM of the first embodiment. That is, the investigated FeRAM has structure in which a metal silicide layer 17a' included in a wiring 17' and a lower electrode 9 are in contact with each other, as shown in FIG. 4.

This structure has a merit that the number of processes can be reduced. This is because the contact holes 13, 14 and 16 can be formed at the same time. When this structure is formed, the contact holes 13, 14 and 16 are formed at the same time. After that, the metal silicide layers 15a, 17a' are formed at the same time. Moreover, in succession, the metal wiring layers 15b, 17b' are formed at the same time. It has been considered that due to the merit of the reduction in the number of processes, this structure is the structure optimal for the FeRAM.

However, we found out that this structure causes the conductive defect to be induced between the lower electrode 9 and the wiring 17' and further causes the lower electrode 9 to be stripped. We conclude that this problem results from the reaction between the silicon included in the metal silicide layer 17a' and a platinum film constituting the lower electrode 9. We conclude that the FeRAM of the first embodiment is created as a method to solve this problem.

In the above-mentioned FeRAM of the first embodiment, the thermal stress caused by the metal wiring layers 15b, 16b has no bad influence on the ferroelectric film 10. This is because the metal silicide layers 15a, 16a are formed under the metal wiring layers 15b, 16b. Thus, it is possible to protect the ferroelectric film 10 from being deteriorated.

Also, in the FeRAM, the electrical connection between the lower electrode 9 and the wiring 16 is stable. This is because the metal silicide layer 16a is not in contact with the lower electrode 9. The sureness of the electrical connection between the lower electrode 9 and the wiring 16 can improve the reliability of the FeRAM and the manufacturing yield.

The method for manufacturing the FeRAM in the first embodiment is described in succession.

At first, the field oxide film 2 is formed on the P-type semiconductor substrate 1, as shown in FIG. 5A. A local oxidation of silicon (LOCOS) method is used in forming the field oxide film 2. An element active region 20 is defined by the field oxide film 2. A gate oxide film 21 is formed in the element active region 20.

In succession, the word line 4 is formed as shown in FIG. 5B. At this time, the gate electrode 3c shown in FIG. 2 is formed at the same time. At first, a poly-silicon film of about 1500 nm and a tungsten silicide ($WSi_x$) film of about 150 nm are deposited in turn. Then, a patterning is carried out by using a lithography method and a dry etching method. The gate electrode 3c and the word line 4 are formed at the same time.

Next, donor impurities, such as phosphorus and arsenic, are implanted into the element active region 20 to thereby form the N+ diffusion layers 3a, 3c.

Then, the silicon oxide film including impurities, such as phosphorus and boron, is deposited on the entire surface. The thickness of the silicon oxide film is about 1500 nm. A top surface of the silicon oxide film is smoothed to then form the inter-layer insulation film 5. The smoothing is done by a chemical mechanical polishing (CMP) method.

Next, the contact hole 6 reaching the N+ diffusion layer 3c is formed in the inter-layer insulation film 5, as shown in FIG. 5C.

Then, the tungsten plug 7 is formed. At first, the TiN/Ti film 7a and the tungsten portion 7b are deposited in turn.

Next, an etching back is done. The TiN/Ti film 7a and the tungsten portion 7b are selectively left only inside the contact hole 6, and the tungsten plug 7 is formed.

Next, the plug protection film 8 is formed as shown in FIG. 5D. A silicon nitride film of about 100 nm and a silicon oxide film of about 100 nm are deposited in turn. The silicon nitride film and the silicon oxide film are formed by a plasma CVD method.

The silicon nitride film protects the plasma 7 from being oxidized by a heating process at a high temperature, which is carried out in a subsequent process to form the ferroelectric film 10. In stead of the silicon nitride film, it is possible to use a film, such as a silicon oxidation nitride film (SiON film), which can also protect the plasma 7 from being oxidized.

The silicon oxide film improves the adhesion between the lower electrode 10 and the silicon nitride film. An adhesion between the lower electrode 10 and the silicon nitride film is lacking. The silicon oxide film improves the adhesion between the lower electrode 10 and the silicon nitride film. The silicon oxide film may not be formed if a material having the excellent adhesion to the silicon nitride film is used as the lower electrode 10.

As shown in FIG. 5D, a sputtering method is used to deposit a titanium (Ti) film having a thickness of 20 nm and a platinum (Pt) film having a thickness of 200 nm in turn and then form a metal film 9a.

A ferroelectric film 10a is formed which has a thickness of about 200 nm. The ferroelectric film 10a can be made of PZT film ($PbZr_xTi_{i-x}O_3$) or SBT film ($SrBi_2Ta_xNb_{2-x}O_9$). The ferroelectric film 10a can be formed by using any of a sol-gel method, the sputtering method and an MOCVD (Metal-Organic Chemical Vapor Deposition) method. An high temperature annealing in an oxidative ambient is done to form the ferroelectric film 10a. During the annealing, the above-mentioned plug protection film 8 prevent the tungsten plug 7 from being oxidized.

Then, a sputtering method is used to deposit an $Iro_2$ film of 50 nm and an iridium film of 100 nm in turn. Thus, a metal film 11a is formed.

As shown in FIG. 5F, the metal-film 11a is patterned by a lithography method, and the upper electrode 11 is formed.

Then, the metal film 9a and the ferroelectric film 10a are patterned by a lithography method, and the lower electrode 9 and the ferroelectric film 10 are formed.

Then, as shown in FIG. 5G, a part of the ferroelectric film 10 is removed to thereby form a contact formation 22 reaching the lower electrode 10. The contact formation 22 is formed by using the lithography method and a wet etching method. When the ferroelectric film 10 is composed of the PZT film, it is etched with a wet etching solution composed of hydrofluoric acid and nitric acid.

Then, as shown in FIG. 5H, an inter-layer insulation film 12 having a thickness of about 400 nm is deposited. The inter-layer insulation film 12 is composed of a silicon oxide film deposited in an ozone-included ambient by a CVD method using TEOS (Tetra-ethyl ortho-silicate) as a source of silicon.

Then, as shown in FIG. 5I, a contact hole 13 reaching the upper electrode 12 is formed by a lithography method.

After that, in order to remove the damage added to the ferroelectric film 10, annealing is carried out for 10 minutes in oxygen atmosphere at a temperature of 600° C. Then, a contact 14 to the plug 7 is formed by using the lithography method and the dry etching method.

As shown in FIG. 5K, the sputtering method is used to then deposit a metal silicide film 23 such as tungsten silicide (WSi$_x$) on the entire surface. The metal silicide film 23 has a thickness of about 50 nm.

Before the deposition of the metal silicide film 23, it is desirable to etch the oxidized layer formed on the surface of the iridium film included in the upper electrode 11. If the oxidized layer is present on the surface of the iridium film, the portion in contact with the iridium film in the metal silicide film 23 is oxidized by a heating process in a subsequent process. This results in a problem that a contact resistance between the upper electrode 12 and the metal silicide film 23 is large. In order to avoid this problem, it is desirable to etch the oxidized layer. The oxidized layer can be etched by using any of a dry etching using a reaction gas of CF4 and the like, a wet etching using buffered hydrofluoric acid, and a combination thereof.

As shown in FIG. 5K, the metal silicide film 23 and the inter-layer insulation film 12 are etched by the lithography method, and a contact hole 16 is formed which reaches the lower electrode 9.

Then, the metal silicide layers 15a, 17a and the metal wiring layers 15b, 17b are formed to thereby form the FeRAM shown in FIGS. 3A and 3B. At first, the sputtering method is used to deposit a titanium film having a thickness of 30 nm, a titanium nitride film (TiN) having a thickness of 100 nm, aluminum (Al) having a thickness of about 500 nm and a titanium nitride (TiN) film having a thickness of about 30 nm, in turn. Then, those films and the metal silicide film 23 are collectively patterned to thereby form the metal silicide layers 15a, 17a and the metal wiring layers 15b, 17b. At this time, the bit line 19 is also formed at the same time.

The FeRAM in the first embodiment is manufactured by the above-mentioned manufacturing method. In this manufacturing method, the metal silicide layer 17a and the lower electrode 9 are not in contact with each other, which stable the connection between the lower electrode 9 and the wiring layer 17b.

Second Embodiment

Figure 6A:
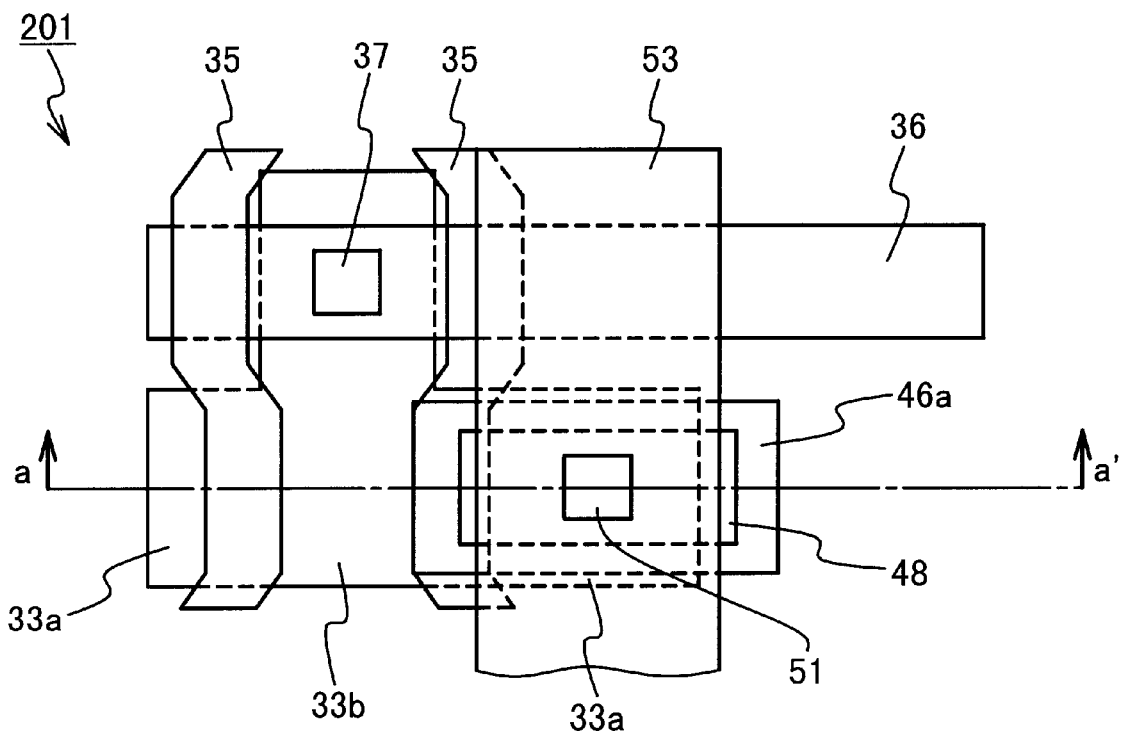
FIG. 6A is a section view showing a structure of a memory cell area of an FeRAM according to a second embodiment.

FIGS. 6A, 6B, 7A and 7B show the structure of an FeRAM in a second embodiment. FIG. 6A is a plan view showing the structure of a memory cell area 201 of the FeRAM in the second embodiment. The memory cell area 201 is an area in which a memory cell of the FeRAM is formed.

Figure 6B:
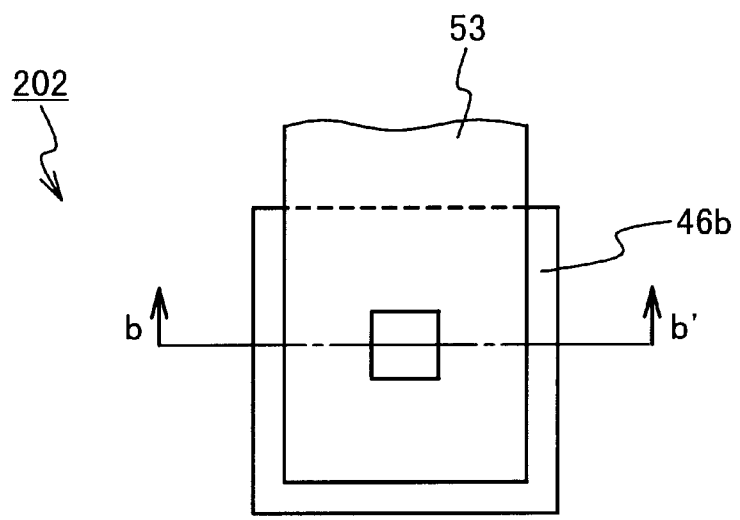
FIG. 6B is a section view showing a structure of a contact formation area of the FeRAM according to the second embodiment.

The FIG. 6B is a plan view showing the structure of a contact formation area 202 of the FeRAM in the second embodiment. The contact formation area 202 is an area in which a contact for connecting a plate line 52 of the memory cell in the FeRAM and a P-type semiconductor substrate 31 are connected to each other.

Figure 7A:
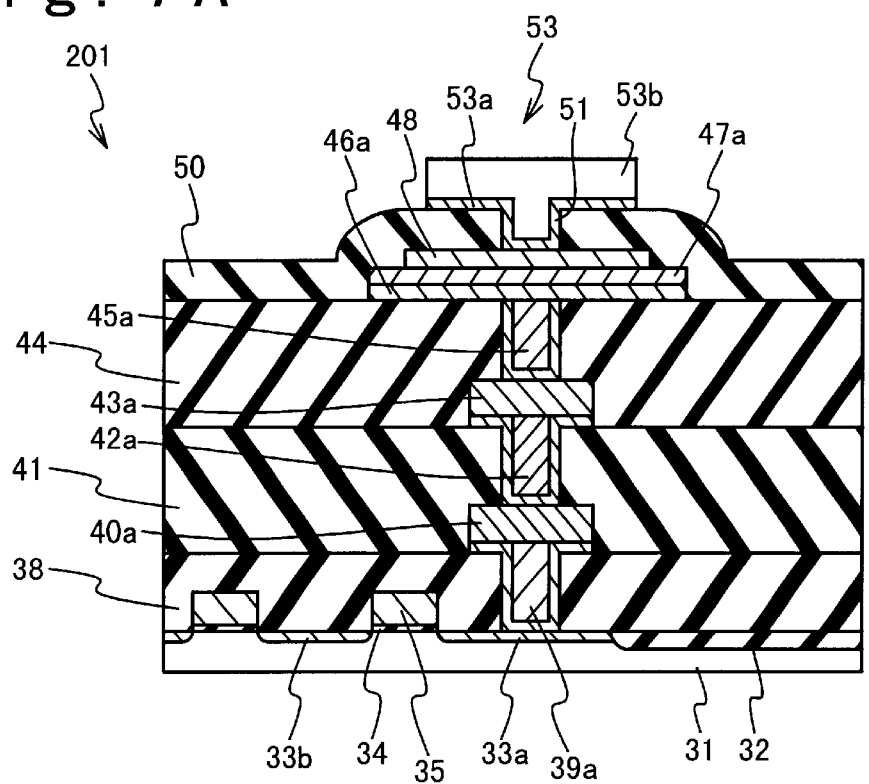
FIG. 7A is a section view showing a structure of a memory cell area of the FeRAM according to the second embodiment.
Figure 7B:
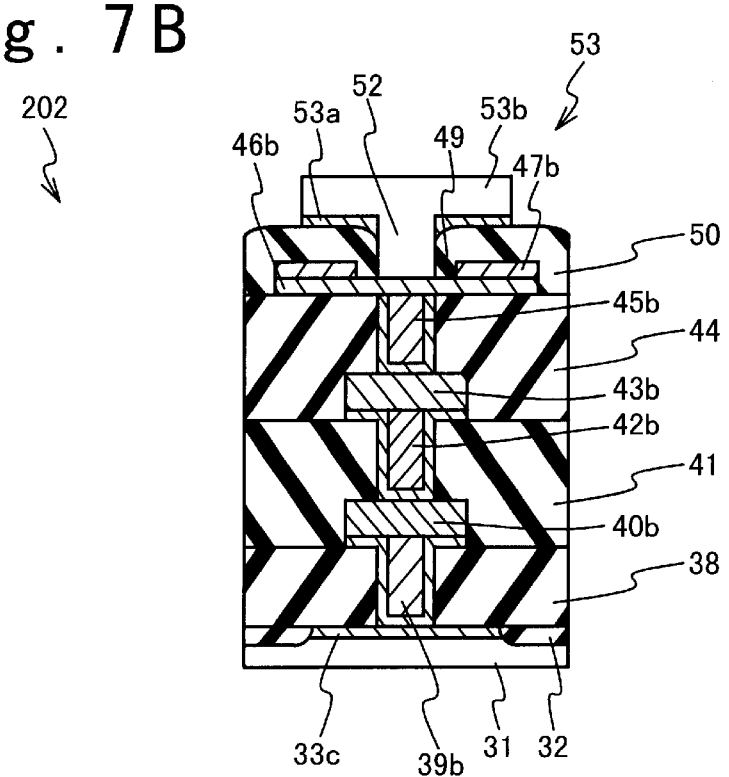
FIG. 7B is a section view showing a structure of a contact formation area of the FeRAM according to the second embodiment.

FIG. 7A is a section view showing the sectional structure taken on the section c–c' of FIG. 6A. That is, FIG. 7A is the section view showing the sectional structure of the memory cell of the FeRAM. FIG. 7B is a sectional view showing the sectional structure taken on the section d–d' of FIG. 6B.

As shown in FIGS. 7A and 7B, the FeRAM has the P-type semiconductor substrate 31. A field oxide film 32, and N+ diffusion layers 33a, 33b and 33c are formed in the P-type semiconductor substrate 31. Moreover, a gate oxide film 34 and a gate electrode 35 are formed on the P-type semiconductor substrate 31.

The N+ diffusion layers 33a, 33b, the gate oxide film 34 and the gate electrode 35 constitute an MOS transistor. The N+ diffusion layer 33b is connected through a plug 37 to a bit line 36, as shown in FIG. 6A.

As shown in FIGS. 7A and 7B, a first inter-layer insulation film 38 is formed on the field oxide film 32, the N+ diffusion layers 33a, 33b and 33c, the gate oxide film 34, and the gate electrode 35. First tungsten plugs 39a, 39b are formed while penetrating the first inter-layer insulation film 38. The first tungsten plug 39a is connected to the N+ diffusion layer 33a. The first tungsten plug 39b is connected to the N+ diffusion layer 33c.

First metal wirings 40a, 40b are formed and connected to the first tungsten plugs 39a, 39b, respectively. A second inter-layer insulation film 41 is formed on the first inter-layer insulation film 38 and the first metal wirings 40a, 40b.

Second tungsten plugs 42a, 42b are formed while penetrating the second inter-layer insulation film 41. The second tungsten plugs 42a, 42b are connected to the first metal wirings 40a, 40b, respectively.

Second metal wirings 43a, 43b are formed and connected to the second tungsten plugs 42a, 42b, respectively. A third inter-layer insulation film 44 is formed on the second inter-layer insulation film 41 and the second metal wirings 43a, 43b.

Third tungsten plugs 45a, 45b are formed while penetrating the third inter-layer insulation film 44. The third tungsten plugs 45a, 45b are connected to the second metal wirings 43a, 43b, respectively.

Bottom electrodes 46a, 46b are formed on the third inter-layer insulation film 44. The bottom electrode 46a is connected to the third tungsten plug 45a. The bottom electrode 46a functions as a storage node of the memory cell of the FeRAM.

The bottom electrode 46b is connected to the third tungsten plug 46b. The bottom electrode 46b can be used as a conductive island to be connected to other wiring layers. In the FeRAM, the bottom electrode 46b makes the connection between the third tungsten plug 46b and a later-described plate line 53 easy. The electrode 46b enlarges a facility for arranging elements and interconnections of the FeRAM.

A ferroelectric film 47a is formed on the bottom electrode 46a in the memory cell area 201, as shown in FIG. 7A. An upper electrode 48 is formed on the ferroelectric film 47a.

On the other hand, in the contact formation area 202, a ferroelectric film 47b is formed on the bottom electrode 46b, as shown in FIG. 7B. A part of the ferroelectric film 47b is removed to thereby form a contact formation 49.

An inter-layer insulation film 50 is formed on the third inter-layer insulation film 44, the bottom electrodes 46a, 46b, the ferroelectric films 47a, 47b and the upper electrode 48.

A contact hole 51 reaching the upper electrode 48 is formed in the inter-layer insulation film 50, as shown in FIG. 7A. Also, a contact hole 52 reaching the bottom electrode 46b is formed in the inter-layer insulation film 50, as shown in FIG. 7B.

The plate line 53 is formed on the inter-layer insulation film 50. As shown in FIG. 7A, the plate line 53 is connected through the contact hole 51 to the upper electrode 48. Also, as shown in FIG. 7B, the plate line 53 is connected through the contact hole 52 to the bottom electrode 46b. The plate line 53 includes the metal silicide layer 53a and the metal wiring layer 53b.

The metal silicide layer 53a is made of silicide material such as tungsten silicide. The metal silicide layer 53a is connected to the upper electrode 48, as shown in FIG. 7A.

On the other hand, the metal silicide layer 53a is not in contact with the lower electrode 46b, as shown in FIG. 7B.

The metal wiring layer 53b is formed on the metal silicide layer 53a. The metal wiring layer 53b includes a Ti film, a TiN film, an Al film and a TiN film which are laminated in turn and not shown at all. The Tim film is connected to the metal silicide layer 53a.

The metal silicide layer 53a is not connected directly to the upper electrode 48. On the other hand, the metal wiring layer 53b is connected directly to the bottom electrode 46b. That is, the Ti film located in the lowest layer of the metal wiring layer 53b is connected directly to the bottom electrode 46b.

In the above-mentioned FeRAM of the second embodiment, the thermal stress caused by the metal wiring layer 53b has no bad influence on the ferroelectric film 47a. This is because the metal silicide layer 53a is formed under the metal wiring layer 53b. Thus, it is possible to protect the ferroelectric film 47a from being deteriorated.

On the other hand, in the FeRAM, the electrical connection between the lower electrode 46b and the plate line 53 is stable. This is because the metal silicide layer 53a is not in contact with the lower electrode 46b. The sureness of the electrical connection between the lower electrode 46b and the plate line 53 can improve the reliability of the FeRAM and the manufacturing yield.

The method for manufacturing the FeRAM in the second embodiment is described in succession.

At first, field oxide films 32a, 32b are formed on the P-type semiconductor substrate 31 by using the LOCOS method, as shown in FIG. 8A. After that, the gate oxide film 34 is formed in an element active region 60 partitioned by the field oxide films 32a, 32b.

Next, the gate electrode 35 is formed as shown in FIG. 8B. At first, a poly-silicon film having a thickness of about 1500 nm and a tungsten silicide ($WSi_x$) film having a thickness of about 150 nm are deposited in turn. Then, their films are patterned by using the lithography method and the dry etching method. So, the gate electrode 35 is formed.

Impurities, such as phosphorus and arsenic, are implanted into the element active region 60 to thereby form the N+ diffusion layers 33a to 33c.

The first inter-layer insulation film 38 is deposited on the entire surface. The first inter-layer insulation film 38 is the silicon oxide film which includes impurities, such as phosphorus (P), boron (B) and the like, and has a thickness of about 1500 nm. Then, a top surface of the first inter-layer insulation film 38 is smoothed by a CMP method.

As shown in FIG. 8C, the first tungsten plugs 39a, 39b are formed in the first inter-layer insulation film 38. At first, contact holes 61a, 61b reaching the N+ diffusion layers 33a, 33b are formed. Next, first TiN/Ti films 62a, 62b and first tungsten films 63a, 63b are deposited in turn. Next, the first tungsten films 63a, 63b are etched back. The first tungsten films 63a, 63b are selectively left only inside the contact holes 61a, 61b.

Moreover, the aluminum film and the titanium nitride film are deposited in turn on the entire surface. Then, the aluminum film, the titanium nitride film and the above-mentioned first TiN/Ti films 62a, 62b are patterned to thereby form the first metal wirings 40a, 40b.

The second inter-layer insulation film 41 is formed as shown in FIG. 8D. At first, a silicon oxide film having a thickness of about 2000 nm is grown on the entire surface by a CVD method. After that, it is smoothed by a CMP method, and the second inter-layer insulation film 41 is formed.

Moreover, the second tungsten plugs 42a, 42b are formed in the second inter-layer insulation film 41. At first, contact holes 64a, 64b reaching the first metal wirings 40a, 40b are formed. Second TiN/Ti films 65a, 65b and second tungsten films 66a, 66b are deposited in turn. Next, the second tungsten films 66a, 66b are etched back. The second tungsten films 66a, 66b are selectively left only inside the contact holes 64a, 64b.

Moreover, in succession, the aluminum film and the titanium nitride film are deposited in turn on the entire surface. Then, the aluminum film, the titanium nitride film and the above-mentioned second TiN/Ti films 65a, 65b are patterned to thereby form the second metal wirings 43a, 43b.

Figure 8E:
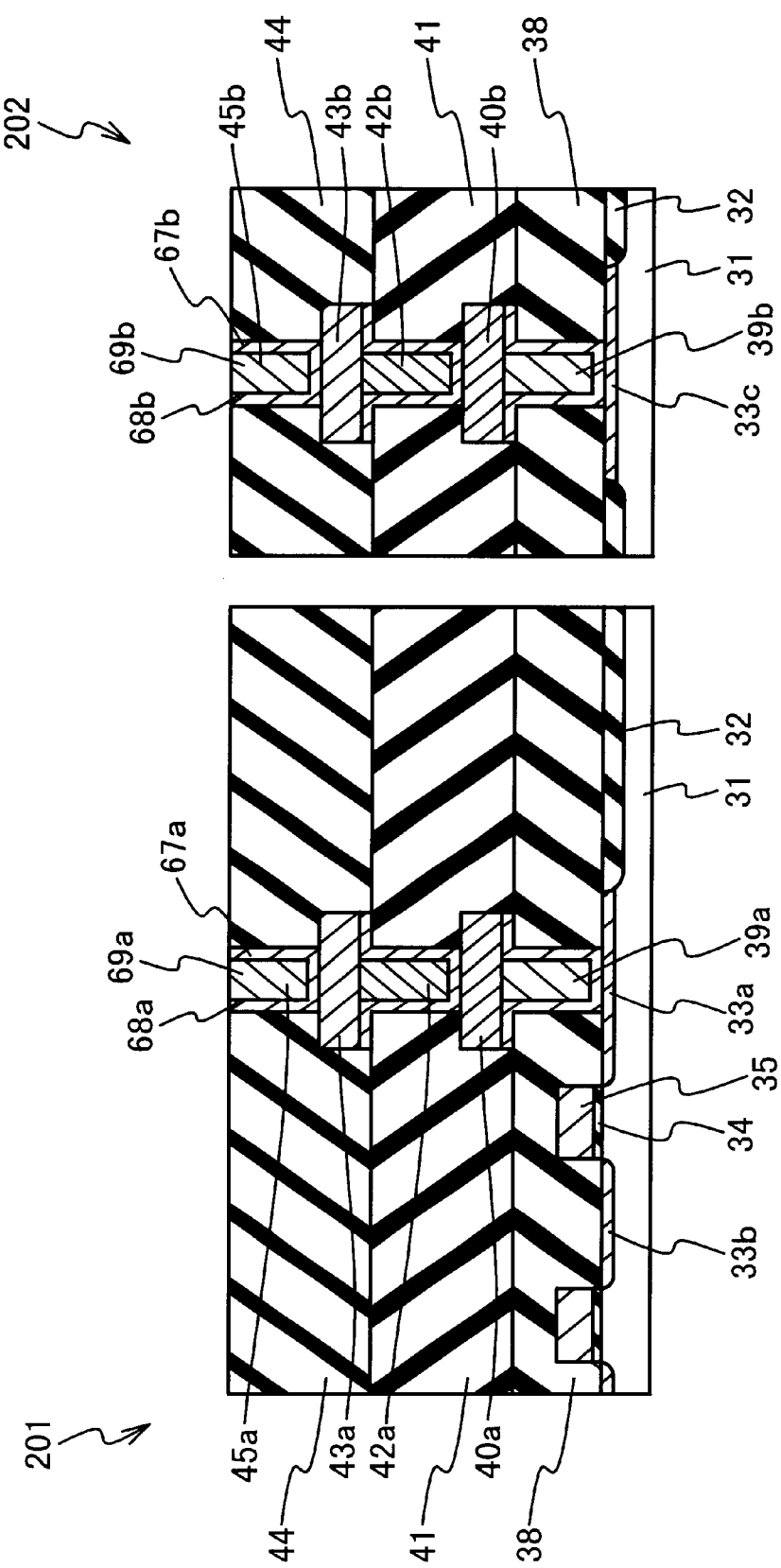

Next, the third inter-layer insulation film 44 is formed as shown in FIG. 8E. Contact holes 67a, 67b reaching the second metal wirings 43a, 43b are formed. Third TiN/Ti films 68a, 68b and third tungsten plug films 69a, 69b are deposited in turn.

After that, the portions outside the contact holes 67a, 67b in the third TiN/Ti films 68a, 68b and the third tungsten plug films 69a, 69b are removed by using the CMP method. The portions inside the contact holes 67a, 67b in the third TiN/Ti films 68a, 68b and the third tungsten plug films 69a, 69b are selectively left to thereby become the third tungsten plugs 45a, 45b.

Figure 8F:
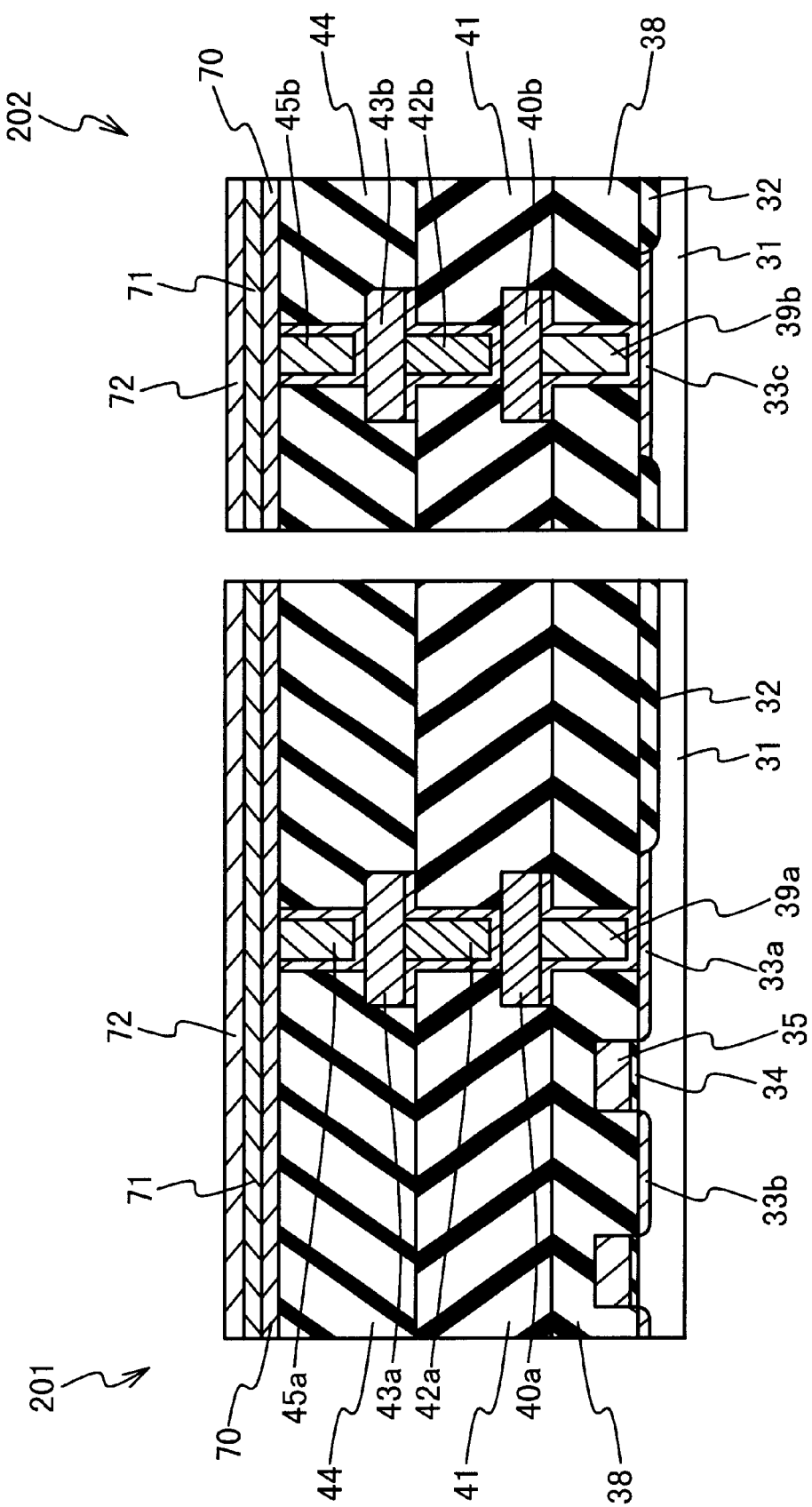

As shown in FIG. 8F, the sputtering method is used to deposit a titanium (Ti) film having a thickness of 20 nm, a titanium nitride (TiN) film having a thickness of about 50 nm and a platinum (Pt) film having a thickness of 100 nm in turn to thereby form a bottom electrode film 70. The bottom electrode film 70 is patterned in a subsequent process, and becomes the lower electrodes 46a, 46b.

A ferroelectric film 71 is formed which has a thickness of about 200 nm. The ferroelectric film 71 is made of ferroelectric material, for example, such as PZT ($PbZr_xTi_{1-x}O_3$) and SBTN ($SrBi_2Ta_xNb_{2-x}O_9$). The ferroelectric film 71 can be formed by any of the sol-gel method, the sputtering method and the MOCVD method. The ferroelectric film 71 is patterned by a subsequent process, and becomes the ferroelectric films 47a, 47b.

The sputtering method is used to deposit an $IrO_2$ film having a thickness of 50 nm and an iridium film having a thickness of 100 nm in turn. An upper electrode film 72 is formed. The upper electrode film 72 is patterned by a late-described process, and becomes the upper electrode 48.

Figure 8G:
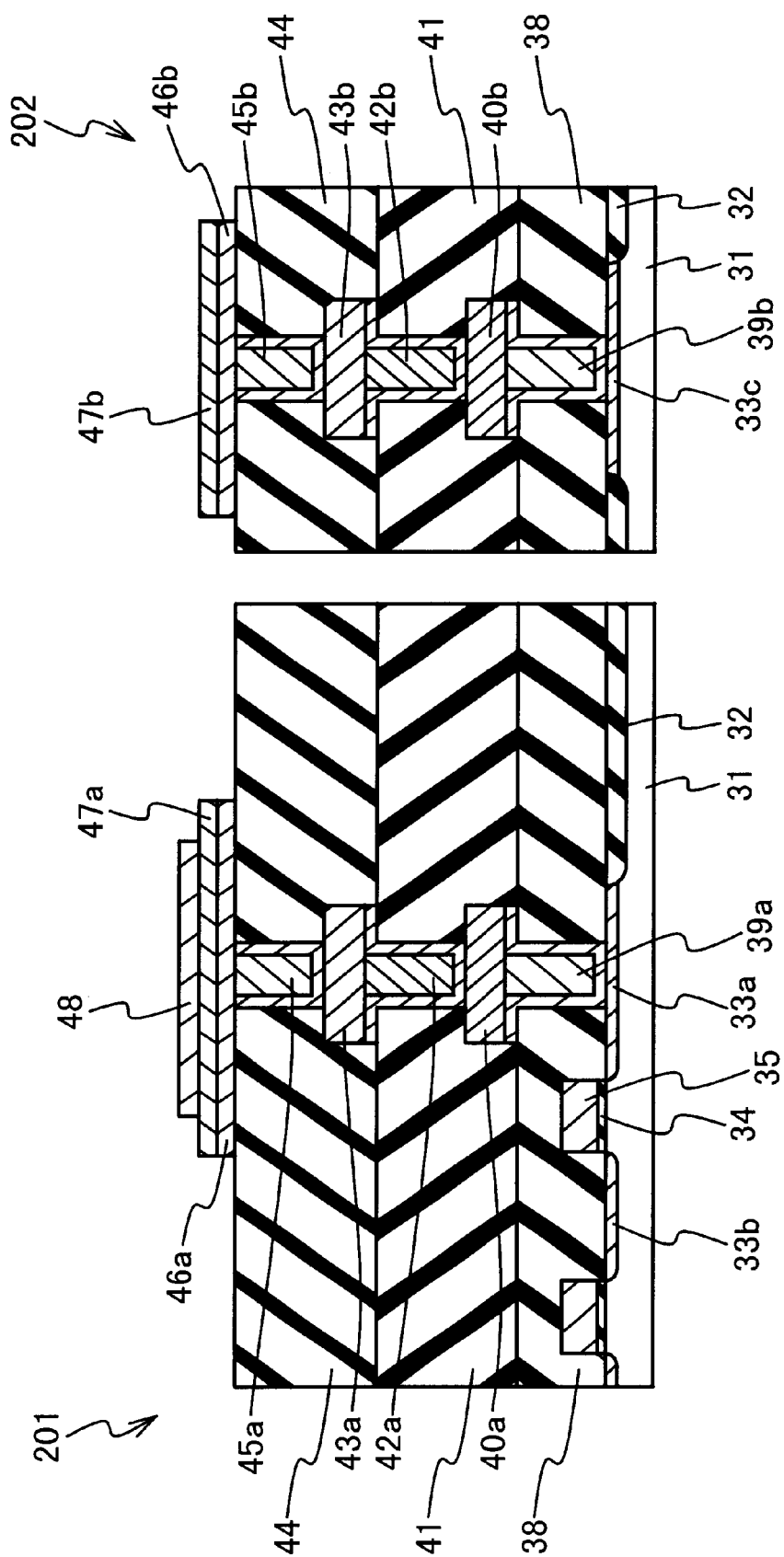

Then, as shown in FIG. 8G, the upper electrode film 72 is patterned by a lithography method, and the upper electrode 48 is formed. Then, the bottom electrode film 70 and the ferroelectric film 71 are patterned by a lithography method to thereby form the bottom electrodes 46a, 46b and the ferroelectric 47a, 47b.

Figure 8H:
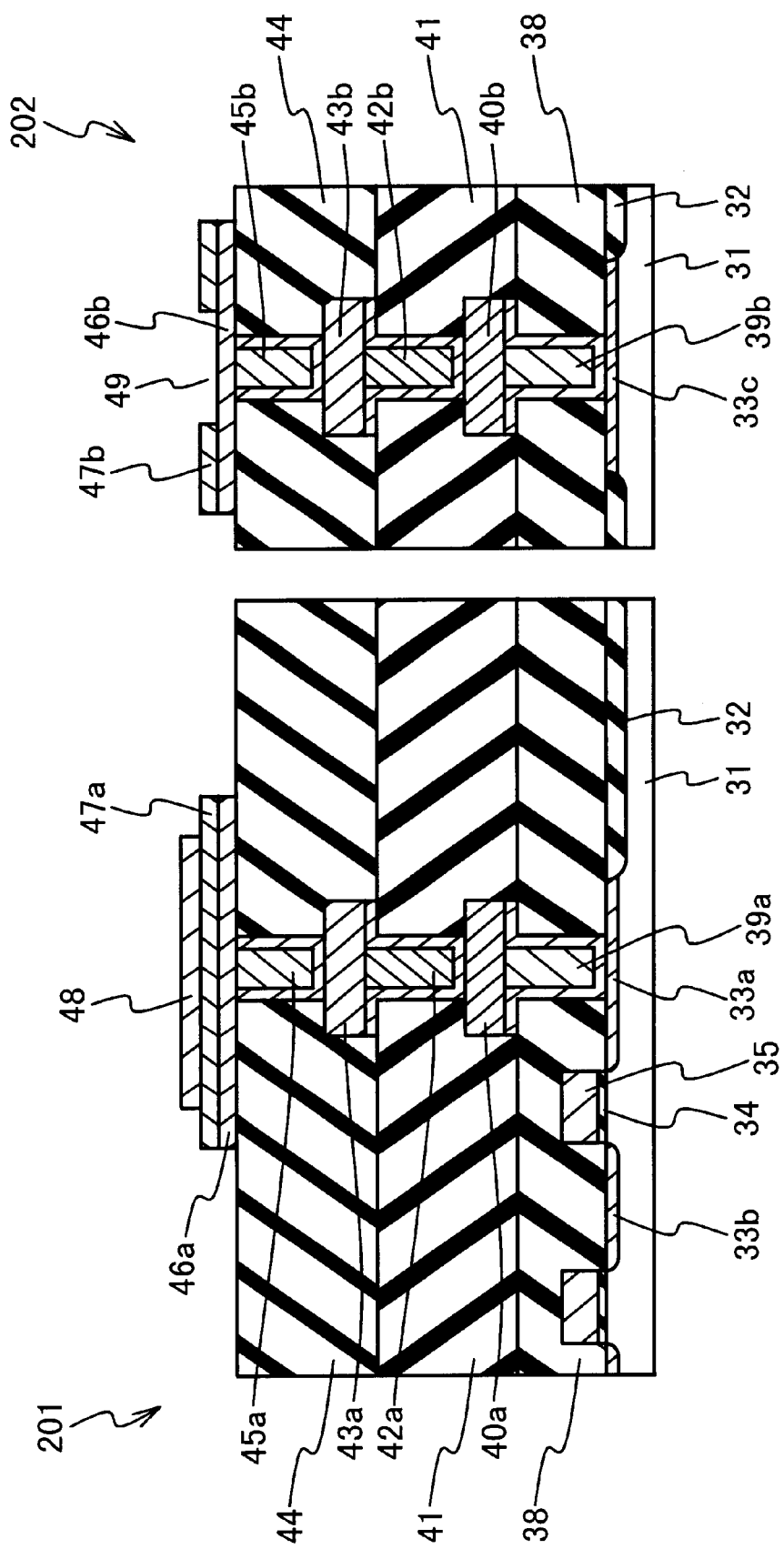
Figure 81:
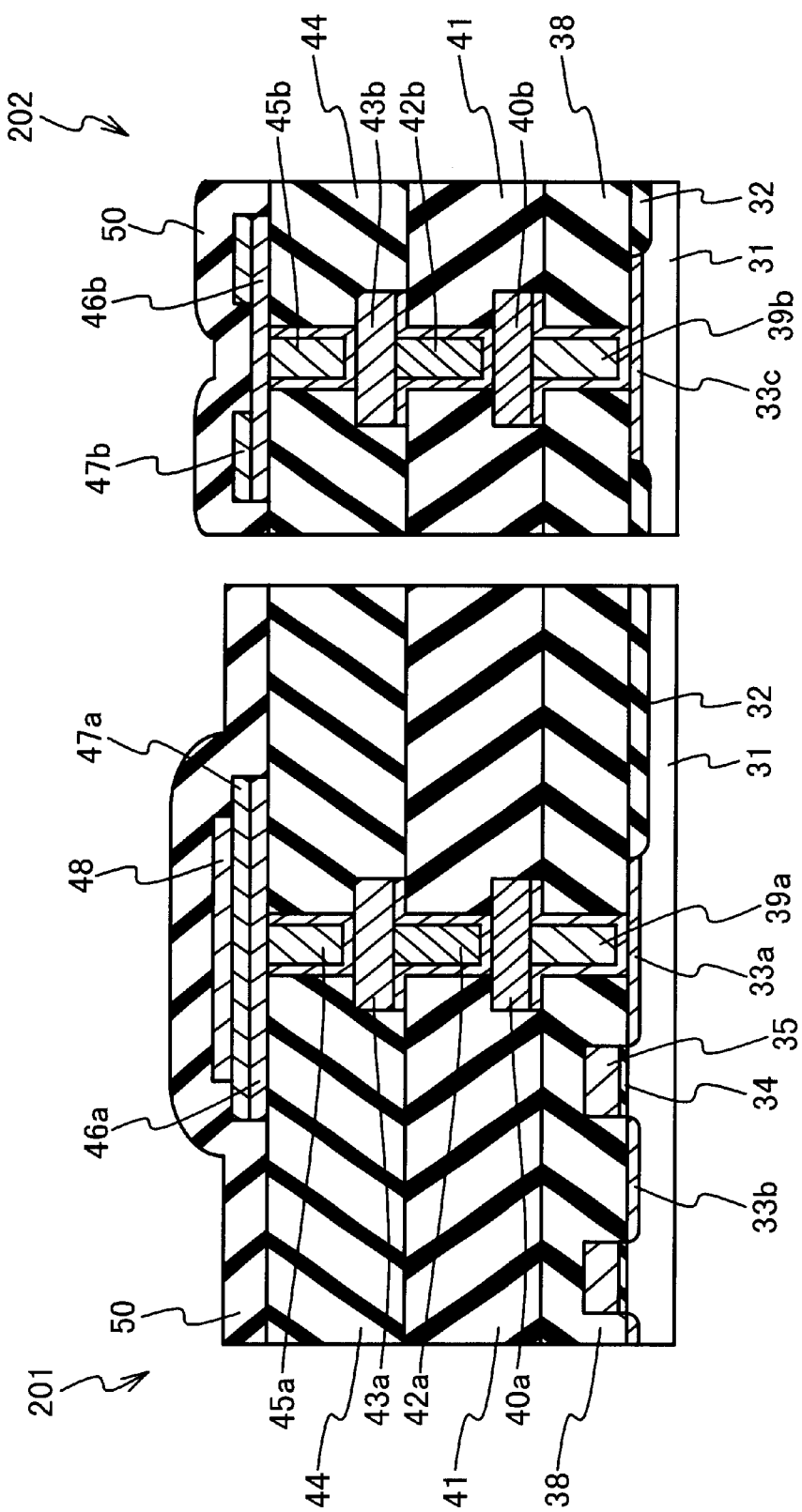

Then, as shown in FIG. 8H, a part of the ferroelectric film 47b is removed to thereby form a contact formation 49 reaching the lower electrode 46b. The contact formation 49 is formed by a wet etching process. When the ferroelectric film 47b is made of the PZT ($PbZr_xTi_{1-x}O_3$), the etching solution used in the wet etching process is a mixture solution of hydrofluoric acid and nitric acid.

As shown in FIG. 8I, the inter-layer insulation film 50 having a thickness of about 400 nm is deposited. The inter-layer insulation film 50 is the silicon oxide film deposited by using the $O_3$-CVD method in which TEOS is used as a source material.

Figure 8J:
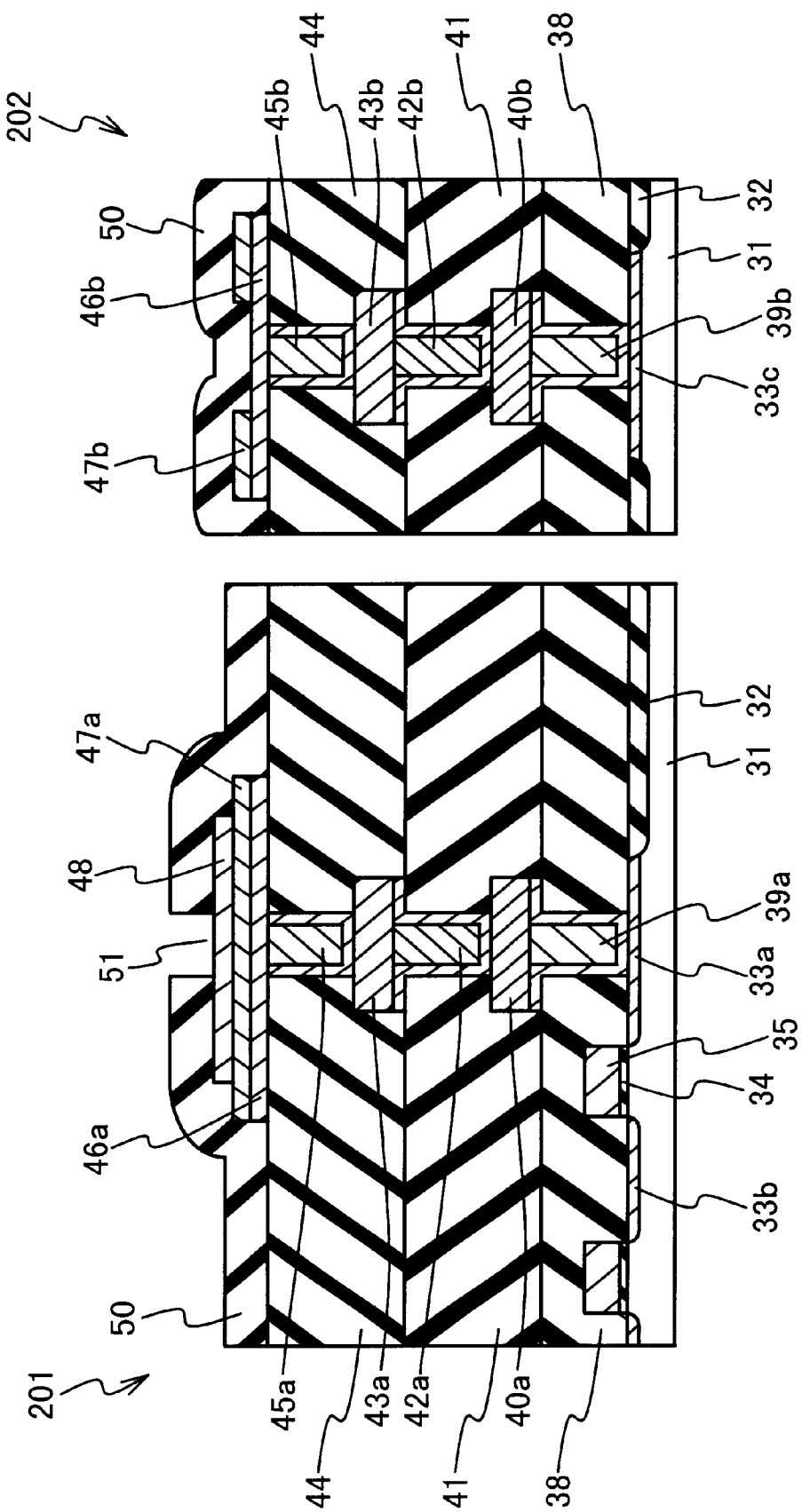

As shown in FIG. 8J, a contact hole 51 reaching the upper electrode 12 is formed by a lithography method. Next, the annealing is carried out for 10 minutes in oxygen atmosphere at a temperature of 350 to 450° C.

Figure 8K:
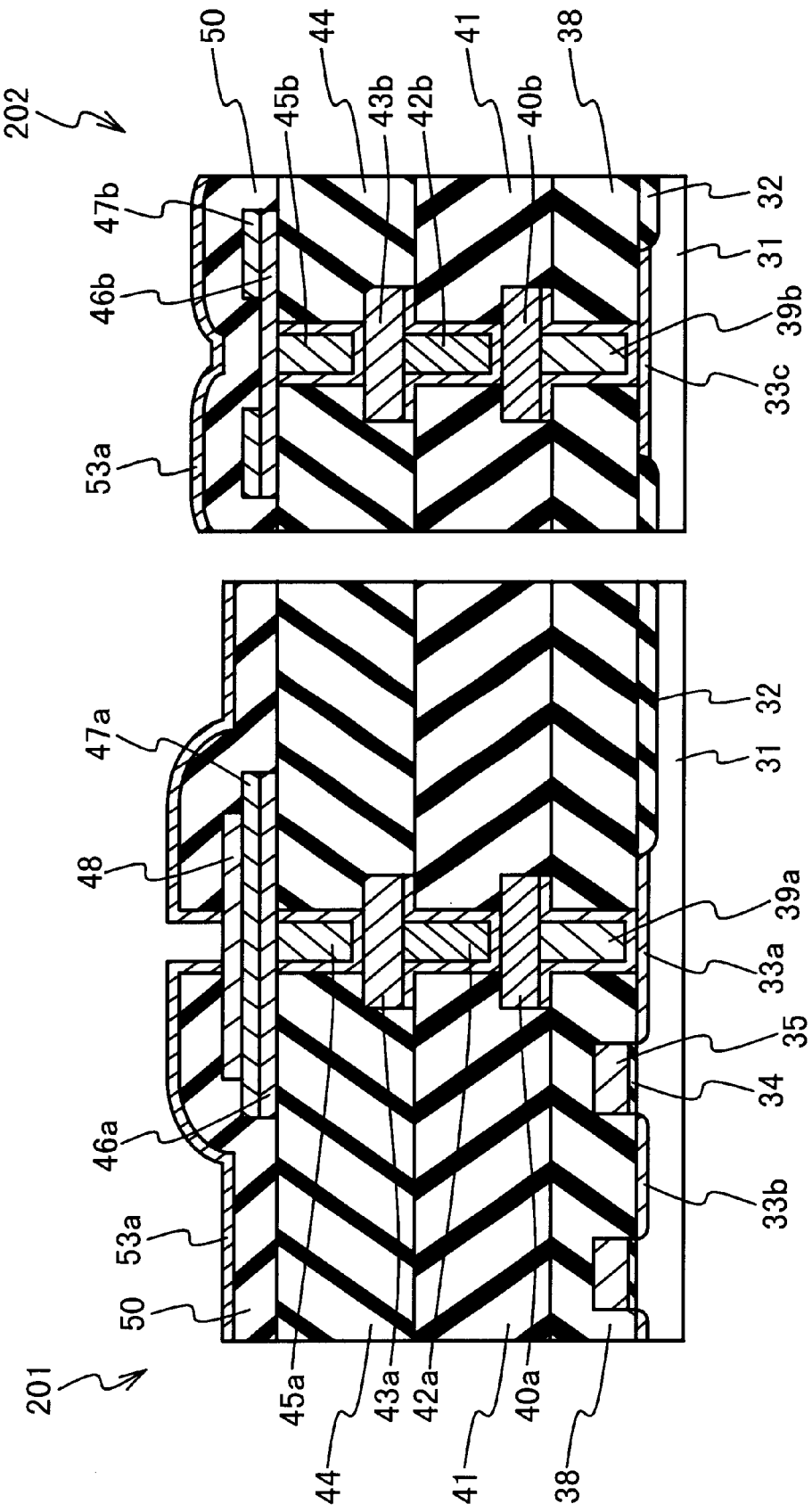

As shown in FIG. 8K, a metal silicide layer 53a having a thickness of about 50 nm is deposited on the entire surface. The metal silicide layer 53a is formed by a sputtering method. The metal silicide layer 53a is made of metal silicide such as tungsten silicide ($WSi_x$).

Figure 8L:
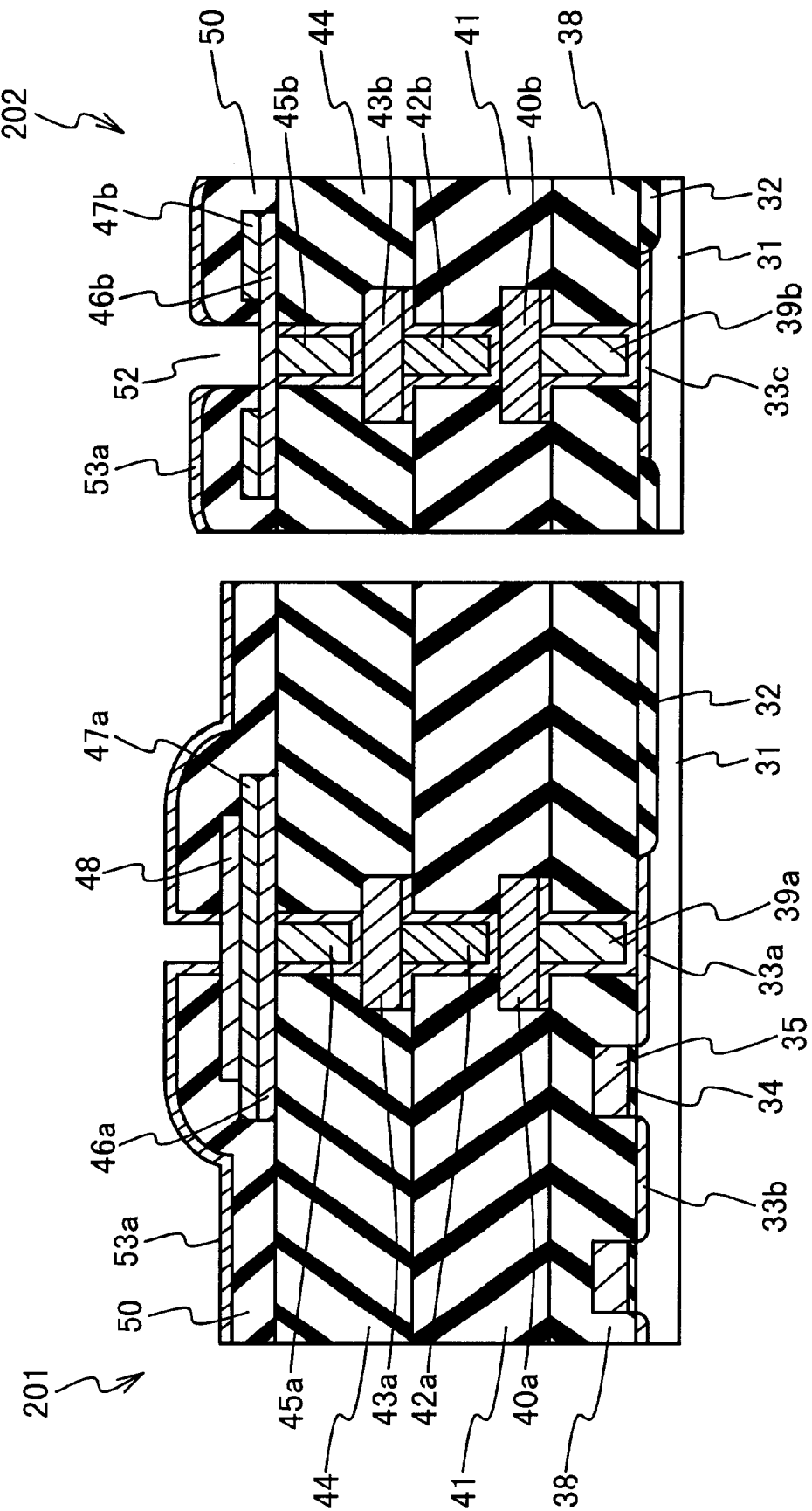

As shown in FIG. 8L, the metal silicide layer 53a and the inter-layer insulation film 50 are etched in turn to thereby form the contact hole 52 reaching the bottom electrode 46b.

Next, the sputtering method is used to deposit a titanium film having a thickness of 30 nm, a titanium nitride film having a thickness of 100 nm, an aluminum film having a thickness of about 500 nm and a titanium nitride film having a thickness of about 30 nm in turn. Then, their films and the metal silicide layer 53a are patterned to thereby form the plate line (third metal wiring) 53.

In the second embodiment, the metal silicide layer 53a is not present inside the contact hole 52. On the other hand, the metal silicide layer 53a is present in the contact hole 51 reaching the upper electrode 48. Thus, the deterioration of the ferroelectric 47a can be protected similarly to the first embodiment. Moreover, the electrical connection is stabilized between the bottom electrode 46b and the plate line 53.

Third Embodiment

Figure 9A:
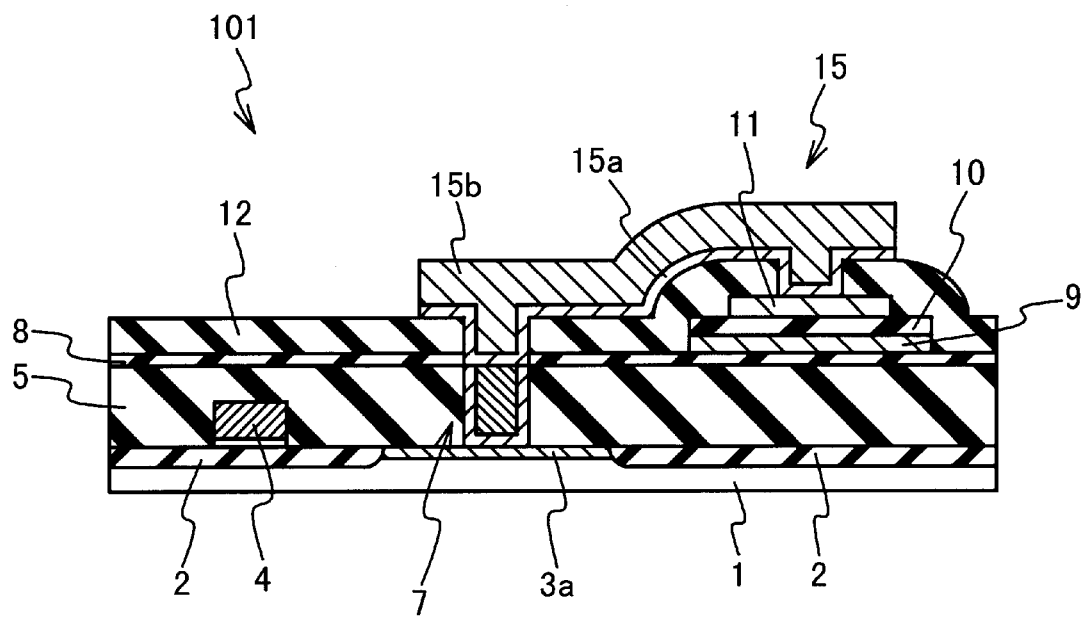
FIG. 9A is a section view showing a structure of a memory cell area of an FeRAM according to a third embodiment.
Figure 9B:
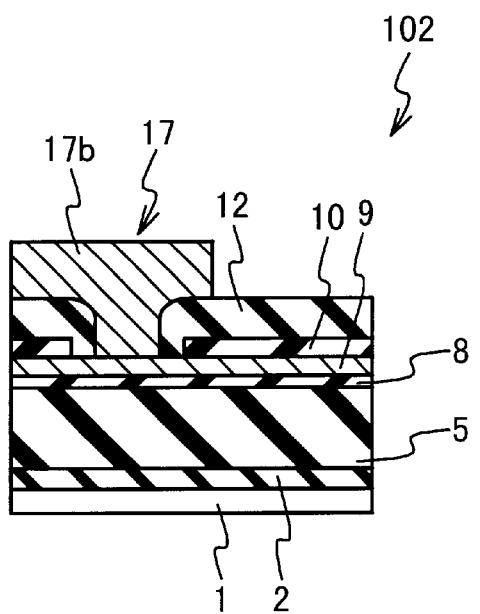
FIG. 9B is a section view showing a structure of a contact formation area of the FeRAM according to the third embodiment.

FIG. 9 is a section view showing the structure of an FeRAM in a third embodiment. The FeRAM in the third embodiment has the structure substantially similar to that of the first embodiment. The FeRAM in the third embodiment is different in structure of a contact formation area 102 from that of the first embodiment.

As shown in FIG. 9, in the FeRAM in the third embodiment, a metal silicide film is removed from the vicinity of a contact hole 16. With regard to this point, the FeRAM in the third embodiment is different from the FeRAM in the first embodiment.

A method for manufacturing the FeRAM in the third embodiment is described in succession. The processes from the process for forming the field oxide film 2 on the P-type semiconductor substrate 1 shown in FIG. 5A to the process for forming the metal silicide layer 23 shown in FIG. 5J are carried out similarly to the first embodiment (FIG. 10A).

As shown in FIG. 10B, a portion 23a in the vicinity in which a contact hole 16 reaching a bottom electrode 9 is selectively removed in the metal silicide layer 23. Then, the contact hole 16 reaching the bottom electrode 9 is formed in the removed portion 23a.

Next, a titanium film having a thickness of 30 nm, a titanium nitride film having a thickness of 100 nm, an aluminum film having a thickness of about 500 nm and a titanium nitride film having a thickness of about 30 nm are deposited in turn. Then, those films and the metal silicide layer 23 are patterned to thereby form a metal wiring 17b connected to a bottom electrode 10 and a metal wiring 15. The FeRAM memory cell is formed by the above-mentioned processes.

In the third embodiment, the metal silicide layer is not in contact with the bottom electrode 9, similarly to the first and second embodiments. The metal silicide layer 15a is in contact with the upper electrode 11. In the third embodiment, the ferroelectric film 10 can be protected from being deteriorated similarly to the first and second embodiments. Moreover, the electrical connection can be stabilized between the bottom electrode 9 and the wiring 17b.

As mentioned above, in any of the first to third embodiments, it is possible to suppress the deterioration of the ferroelectric capacitance caused by the heating process after the formation of the metal wiring. This is because the metal silicide film, such as the tungsten silicide ($WSi_x$) and the like, is formed between the upper electrode and the wiring. The metal silicide film can protect the material constituting the wiring member from being diffused into the upper electrode. Moreover, the metal silicide can effectively protect the bad influence on the ferroelectric film caused by the thermal stress of the wiring. As a result, the deterioration of the ferroelectric film is not easily induced.

Moreover, in any of the first to third embodiments, it is possible to protect the strips of the films in the wiring and the bottom electrode, the conductive defect in the contact to the bottom electrode, and the increase in the resistance. This is because the bottom electrode and the metal silicide are not in direct contact with each other.

Those technical merits can improve the reliability of the ferroelectric memory and the yield of the manufacture.

Although the invention has been described in its preferred form with a certain degree of particularity, it is understood that the present disclosure of the preferred form has been changed in the details of construction and the combination and arrangement of parts may be restored to without departing from the spirit and the scope of the invention as hereinafter claimed.

What is claimed is:

1. A ferroelectric memory comprising:

a wiring layer including substantially no silicon;

a bottom electrode coupled to said wiring layer;

a ferroelectric film formed on said bottom electrode;

a top electrode formed on said ferroelectric film; and a metal silicide layer coupled to said top electrode and located above said ferroelectric film.

2. A ferroelectric memory according to claim 1, wherein said wiring layer and said ferroelectric film are located on a same side of said bottom electrode.

3. A ferroelectric memory according to claim 1, further comprising another metal silicide layer, wherein said wiring layer penetrates said another metal silicide layer.

4. A ferroelectric memory according to claim 3, wherein said another metal silicide layer covers at least a portion of said ferroelectric film.

5. A ferroelectric memory according to claim 1, further comprising:

another bottom electrode fabricated at the same time of said bottom electrode;

another ferroelectric film coupled to said another bottom electrode; and another wiring layer coupled to said another bottom electrode, wherein said another wiring layer penetrates said another ferroelectric film.

6. A ferroelectric memory according to claim 5, wherein said another bottom electrode is electrically connected to still another wiring layer.

7. A ferroelectric memory according to claim 5, further comprising another metal silicide layer fabricated at the same time of said metal silicide layer, wherein said another wiring layer penetrates said another metal silicide layer.

8. A ferroelectric memory according to claim 1, wherein said metal silicide layer is formed of tungsten silicide.

9. A ferroelectric memory according to claim 1, wherein said top electrode includes:

an iridium oxide film; and an iridium film.

10. A ferroelectric memory according to claim 9, wherein said iridium oxide film is formed on said ferroelectric film and said iridium film is formed on said iridium oxide film.

11. A ferroelectric memory according to claim 1, wherein said bottom electrode is formed of platinum.

* * * * *